(12) United States Patent
Tseng

(10) Patent No.: US 10,930,631 B2
(45) Date of Patent: Feb. 23, 2021

(54) DISPLAY APPARATUS, PIXEL ARRAY AND MANUFACTURING METHOD THEREOF

(71) Applicant: Shih-Hsien Tseng, Hsinchu (TW)

(72) Inventor: Shih-Hsien Tseng, Hsinchu (TW)

( * ) Notice: Subject to any disclaimer, the term of this patent is extended or adjusted under 35 U.S.C. 154(b) by 0 days.

(21) Appl. No.: 16/718,076

(22) Filed: Dec. 17, 2019

(65) Prior Publication Data

US 2020/0126961 A1 Apr. 23, 2020

Related U.S. Application Data

(63) Continuation-in-part of application No. 16/175,739, filed on Oct. 30, 2018.

(30) Foreign Application Priority Data

Nov. 3, 2017 (TW) .................. 106138070

(51) Int. Cl.
| | |
|---|---|
| *H01L 25/16* | (2006.01) |
| *G02F 1/1368* | (2006.01) |
| *H01L 25/00* | (2006.01) |
| *G02F 1/1362* | (2006.01) |
| *H01L 27/32* | (2006.01) |
| *G02F 1/1333* | (2006.01) |

(52) U.S. Cl.
CPC .......... *H01L 25/167* (2013.01); *G02F 1/1368* (2013.01); *G02F 1/13336* (2013.01); *G02F 1/136286* (2013.01); *H01L 25/50* (2013.01); *H01L 27/3255* (2013.01); *H01L 27/3293* (2013.01)

(58) Field of Classification Search
CPC ....... H01L 25/167; H01L 25/50; H01L 25/00; H01L 25/07; H01L 25/072; H01L 25/16; H01L 27/3255; H01L 27/3293; H01L 23/13; H01L 23/5385; G02F 1/13336; G02F 1/136286; G02F 1/1368

See application file for complete search history.

(56) References Cited

U.S. PATENT DOCUMENTS

| | | | |
|---|---|---|---|
| 6,633,134 B1 | 10/2003 | Kondo | |
| 6,844,673 B1 | 1/2005 | Bernkopf | |
| 7,242,441 B2 | 7/2007 | Kimura | |
| 9,104,034 B2 | 8/2015 | Chang | |

(Continued)

FOREIGN PATENT DOCUMENTS

| | | |
|---|---|---|
| CN | 106936954 A | 7/2017 |
| EP | 3 073 567 A1 | 9/2016 |

(Continued)

*Primary Examiner* — Sardis F Azongha
(74) *Attorney, Agent, or Firm* — Winston Hsu

(57) ABSTRACT

A pixel array includes a display medium module, an active switching element, and a connecting module. Each display medium module includes two pairs of electrodes and a display medium. Each pair of electrodes has a first electrode and a second electrode. The display medium is disposed between first electrodes and second electrodes. The active switching element is electrically connected to the first electrodes for allowing the first electrodes and the second electrodes to change a state of the display medium. The connecting module is integrated with the display medium module to electrically connect the active switching element to the first electrodes via conductors of the connecting module.

21 Claims, 39 Drawing Sheets

(56) References Cited

U.S. PATENT DOCUMENTS

| | | | |
|---|---|---|---|
| 10,170,452 B2 | 1/2019 | Tseng | |
| 2002/0158577 A1 | 10/2002 | Shimoda | |
| 2003/0209713 A1 | 11/2003 | Kimura | |
| 2006/0055864 A1* | 3/2006 | Matsumura | H01L 27/12 349/187 |
| 2010/0328196 A1 | 12/2010 | Cok | |
| 2011/0043105 A1 | 2/2011 | Cok | |
| 2011/0043499 A1 | 2/2011 | Cok | |
| 2011/0050586 A1 | 3/2011 | Miller | |
| 2011/0057861 A1 | 3/2011 | Cok | |
| 2015/0261057 A1* | 9/2015 | Harris | G02F 1/163 359/271 |
| 2016/0315055 A1* | 10/2016 | Vogt | H01L 21/4853 |
| 2017/0090260 A1* | 3/2017 | Yu | G02F 1/13336 |
| 2018/0358298 A1* | 12/2018 | Zhai | H01L 21/4853 |
| 2019/0102016 A1 | 4/2019 | Kim | |

FOREIGN PATENT DOCUMENTS

| | | |
|---|---|---|
| EP | 3 373 564 | 9/2018 |
| JP | 2011-170167 A | 9/2011 |
| JP | 2015-198050 | 11/2015 |
| TW | 200411606 | 7/2004 |
| TW | 201418777 A | 5/2014 |
| TW | 201537730 A | 10/2015 |
| TW | 201740163 A | 11/2017 |
| WO | 03/105113 A1 | 12/2003 |
| WO | 2010/019185 A1 | 2/2010 |
| WO | 2010/056358 A2 | 5/2010 |
| WO | 2010/056358 A3 | 5/2010 |

* cited by examiner

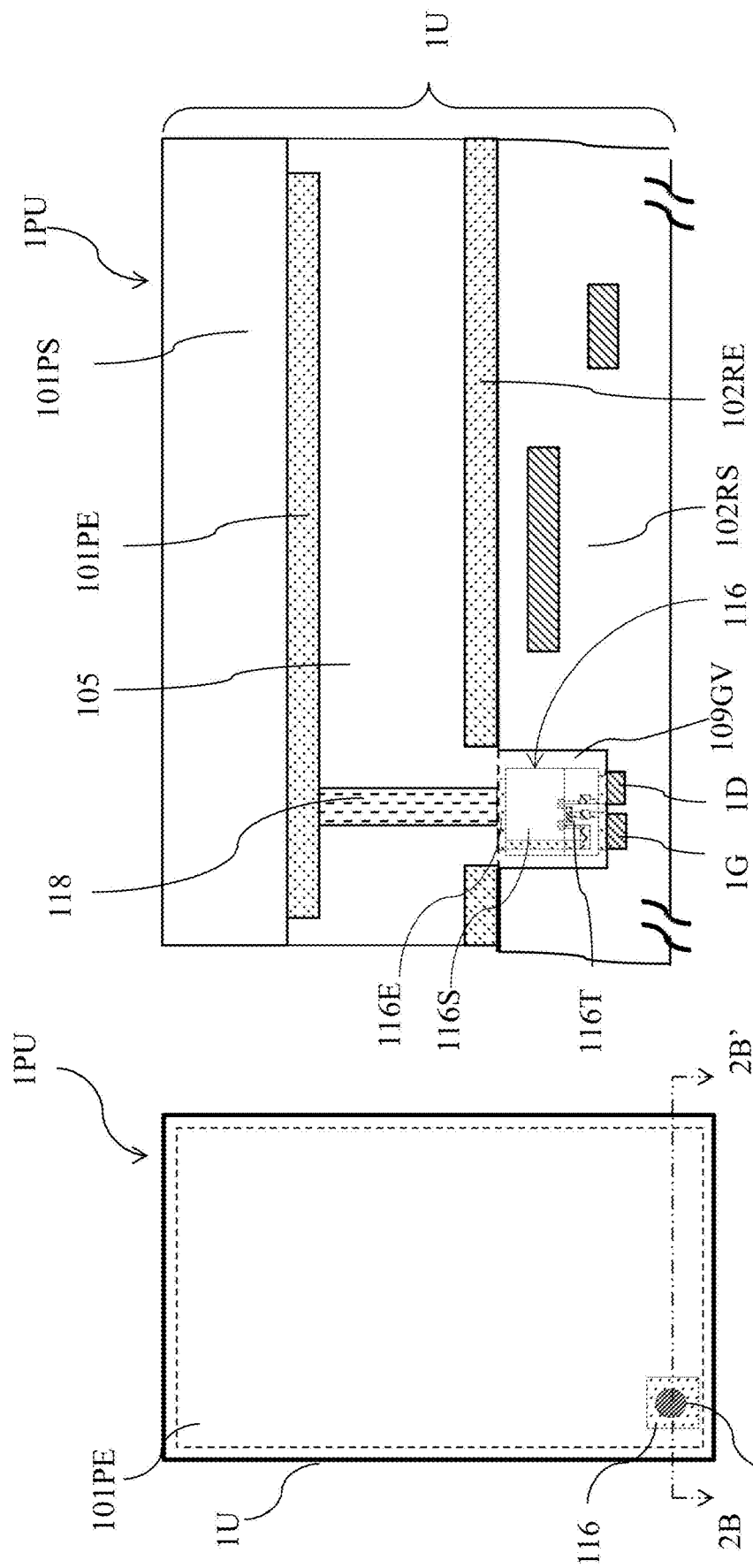

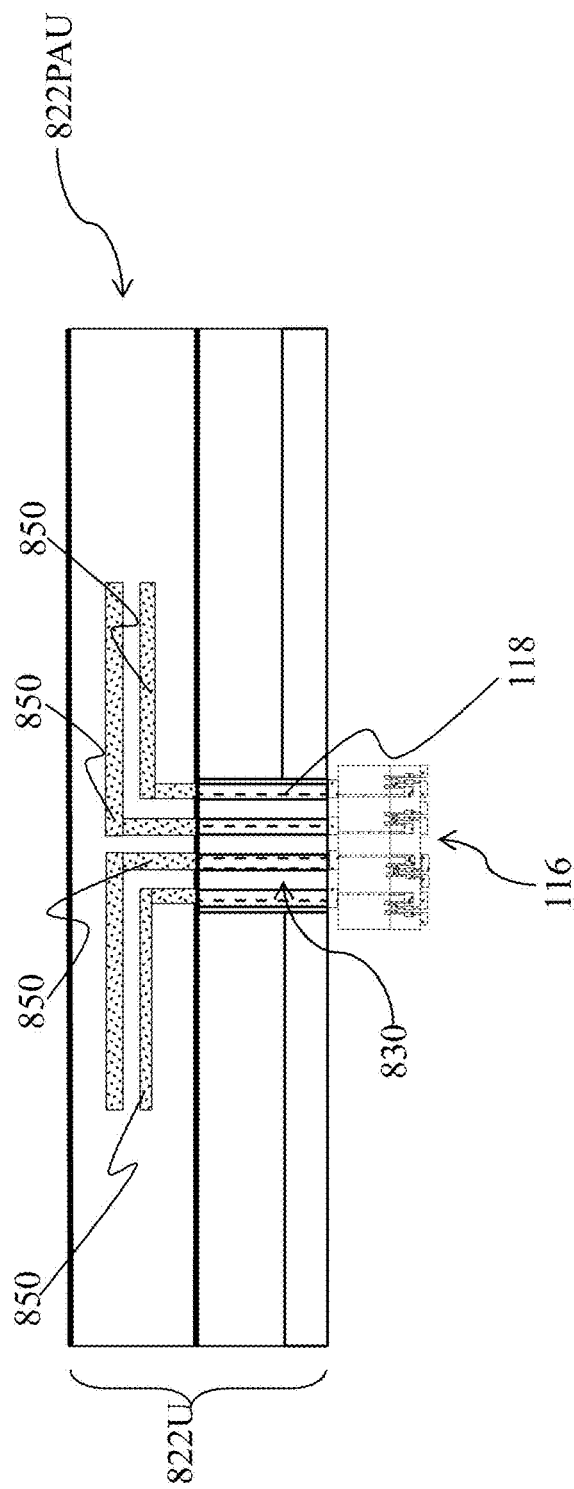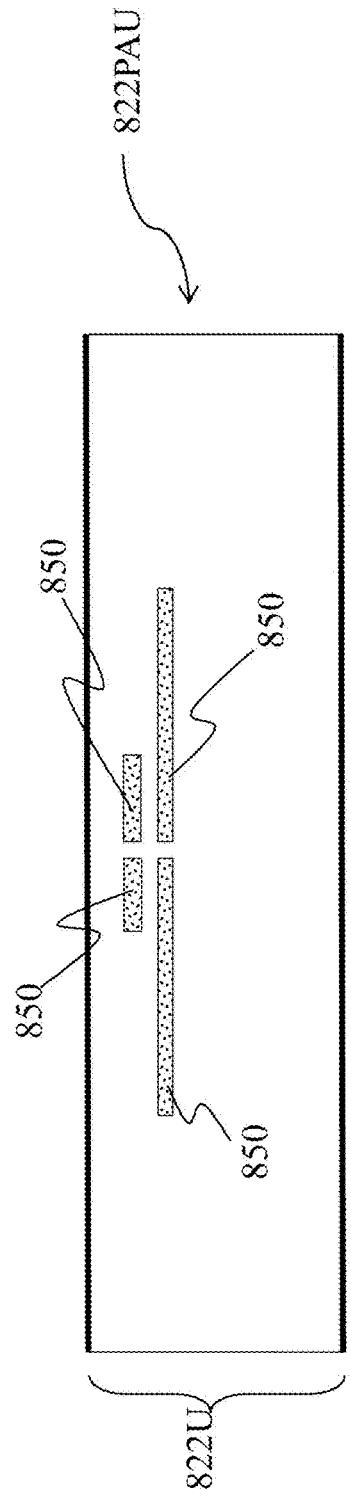
FIG. 29
FIG. 30

DISPLAY APPARATUS, PIXEL ARRAY AND MANUFACTURING METHOD THEREOF

CROSS REFERENCE TO RELATED APPLICATIONS

This application is a continuation-in-part application of U.S. patent application Ser. No. 16/175,739, which was filed on 30 Oct. 2018, entitled "PIXEL UNIT, PIXEL ARRAY, MULTIMEDIA DEVICE AND MANUFACTURING METHOD THEREOF".

BACKGROUND OF THE INVENTION

1. Field of the Invention

The present invention relates to a display apparatus, a pixel array and a manufacturing method thereof, and more specifically, the present invention relates to a pixel array and a display apparatus with a display medium module and a manufacturing method thereof.

2. Description of the Prior Art

With the advancement of technology and time, users are getting more demanding about visual display and voice, and require multimedia devices with the advantages of compactness, high contrast, high dynamic, high color saturation, high aperture ratio, large-sized panel, low cost and low power consumption, high quality, multi-faceted display, easy maintenance and good sound quality and other advantages of multimedia devices.

The display part of the current multimedia device can be divided into self-luminous and non-self-luminous ways to achieve the function of image display, and the liquid crystal display is the main way of non-self-luminous flat panel display device, wherein the amount of light passing through a liquid crystal medium is modulated by controlling the voltage of the upper and lower electrodes of the liquid crystal medium. The effect of color display is achieved with further employment of a color filter layer, a polarizer and some functional optical films, and backlight, etc.

Self-luminous flat panel display may be categorized into field emissive display, plasma display, electroluminescent display, photoluminescent display, organic light-emitting diode display and so on. In an organic light-emitting diode display (OLED), light-emitting polymers are deposited between an upper electrode layer and a lower electrode layer. With further employment of a conductive layer of electrons and holes, and light display is generated by adding the electric field to move the carrier, resulting in electrons and the hole carrier recombination phenomenon. In comparison, an organic light-emitting diode display device is characterized by its wide viewing angle, fast responding speed, thin panel and flexibility; further, it requires neither backlighting nor color filter and may be made large-sized.

The display panel of both LCD and OLED devices has a plate of transparent glass for a substrate, directly and sequentially forming a thin-film transistor, a lower electrode layer, a display medium layer, an upper electrode layer and others thereon. The thin-film transistor may control the voltage or current imposed on the upper electrode layer and/or the lower electrode layer to control the state of the display medium. Since it is necessary to directly and sequentially form a thin film transistor and an electrical conduction pattern on the glass substrate, whereon will be relatively compressed the effective area of pixel unit, and difficult to achieve high aperture rate of pixel unit.

Referring to FIG. 1, a top view of a known pixel 1PP. The pixel unit 1PP may serve as part of a display panel for displaying a pixel part of an image; generally, the pixel unit 1PP includes a glass substrate 10S, and a gate control line 11G, a data control line 12D, a thin film transistor 13T, and a pixel electrode 14PE, and a common display medium and a pixel corresponding electrode, are sequentially set up on the glass substrate 10S. The thin film transistor 13T has a gate, a source, and a drain, respectively, electrically connected to the gate control line 11G, the data control line 12D, and the pixel electrode 14PE, for controlling the state of the display medium, and adjusting the luminous flux of the pixel electrode 14PE. If the use of organic light-emitting diode (OLED) for the display medium, more thin film transistors and capacitors are needed. In addition, in order to embed the touch function, the pixel unit needs to add more signal control lines, and thus more compressed the pixel electrode (light through) the area. Furthermore, each pixel unit 1PP of the display panel is integrally formed with the same glass substrate 10S, the signal control line, the display medium, the pixel corresponding electrode, and it is not easy to replace or repair the pixel unit 1PP which is individually damaged. The larger size of the display demands the bigger range of the glass substrate needed to form the thin film transistor 13T (i.e., the array of the thin film transistors 13T has a large area), it is difficult to control the uniformity for the thin film transistor 13T of the pixel unit 1PP (Such as threshold voltage, current drive capability), the required process equipment becomes expensive, the process becomes complicated, the manufacturing time becomes longer, the cost is higher, the mass production quality and the yield control are less stable and more difficult to accomplish controlling of multi-layer display media and the manufacture of multi-facet display and repair part of the damaged display device.

The frame of display section on the existing multimedia device is refreshed every time must be combined the drive circuit element, located at the periphery of the display pixel unit 1PP, to sequentially drive the thin film transistor 13T of each pixel unit 1PP, and to update and write the content of each pixel unit 1PP, which is easy to cause power consumption issues. To combine the parts of the sound, it is usually necessary to additionally assemble the loudspeaker (speaker), resulting in a complex system with high cost and thinning more difficult.

In view of the foregoing, existing multimedia devices still have various disadvantages to overcome.

SUMMARY OF THE INVENTION

An embodiment of the present invention provides a pixel array. The pixel array comprises a display medium module, an active switching element, and a connecting module. The display medium module comprises at least two pairs of electrodes and a display medium. Each pair of electrodes comprises a first electrode and a second electrode. The display medium is disposed between the first electrodes and the second electrodes of the display medium module. The active switching element is electrically connected to first electrodes for allowing the first electrodes and the second electrodes to change a state of the display medium. The connecting module is integrated with the display medium module and comprises a plurality of conductors for electrically connecting active switching element of the pixel array to first electrodes of the display medium module.

Another embodiment of the present invention provides a display apparatus, which comprises a plurality of pixel arrays. Each pixel array comprises a display medium module, an active switching element, and a connecting module. The display medium module comprises at least two pairs of electrodes and a display medium. Each pair of electrodes comprises a first electrode and a second electrode. The display medium is disposed between the first electrodes and the second electrodes of the display medium module. The active switching element is electrically connected to first electrodes for allowing the first electrodes and the second electrodes to change a state of the display medium. The connecting module is integrated with the display medium module and comprises a plurality of conductors for electrically connecting active switching element of the pixel array to first electrodes of the display medium module.

Another embodiment of the present invention provides a method for manufacturing a pixel array. The method comprises forming a display medium module of the pixel array, the display medium module comprising at least two pairs of electrodes and a display medium, each pair of electrodes comprising a first electrode and a second electrode, and a display medium being disposed between first electrodes and second electrodes of the display medium module; forming an active switching element of the pixel array, the active switching element being electrically connected to the first electrodes for allowing the first electrodes and the second electrodes to change a state of the display medium; forming a perforation in the pixel array; and disposing a connecting module in the perforation to electrically connect the active switching element to the first electrodes via a plurality of conductors of the connecting module.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2A is a top view of a pixel unit according to an embodiment of the present invention.
FIG. 2B is a cross-section view of the pixel unit along the line 2B-2B' in FIG. 2A.

FIG. 29 is a cross-section view of the pixel array along the line 29-29' in FIG. 25.
FIG. 30 is a cross-section view of the pixel array along the line 30-30' in FIG. 25.

DETAILED DESCRIPTION

Figure 1:
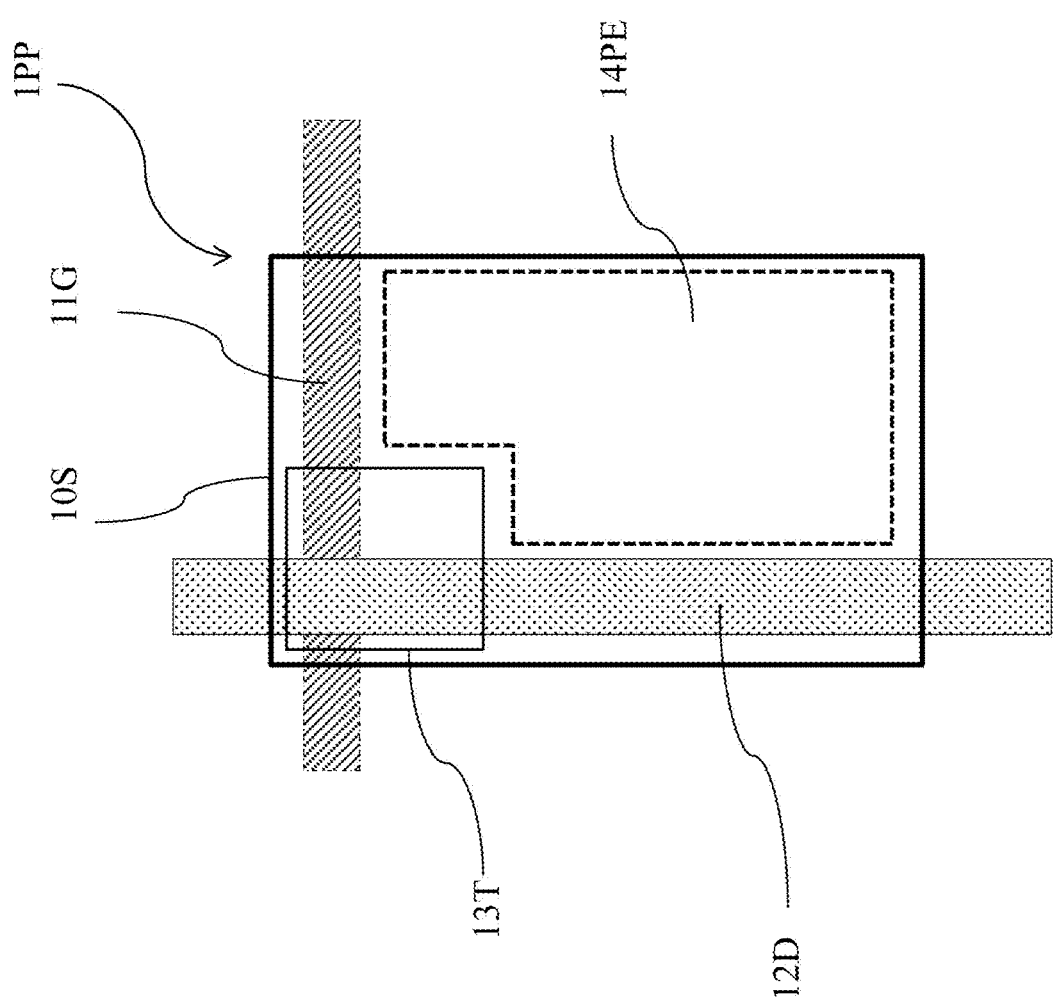
FIG. 1 is a top view of a known pixel unit.

The implementation method of the present invention will be further illustrated by way of the following description of a plurality of embodiments. But it should be noted that the embodiments described below are illustrative and exemplary only rather than limiting the application of the present invention to the described environment, application, structure, procedure or steps. Elements that are not directly related to the present invention are ignored from the drawings. The scale relations among elements in the drawings are illustrated rather than limiting of the actual scales of the present invention. Unless noted otherwise, identical (or similar) reference symbols correspond to identical (or similar) elements.

Please refer to FIG. 2A, showing a top view of a pixel unit 1PU according to an embodiment of the present invention. The pixel unit 1PU may serve as part of a multimedia device having a display function to display a pixel part of an image; that is, a display function device may include one or a plurality of pixel units 1PU according to the present embodiment. The pixel unit 1PU may include an active switching element 116, a display medium module 1U and other elements. The active switching element 116 may be used to control the state of the display medium module 1U to further control the amount of light passing through a display medium module 1U (or modulating the properties of light). More specific technical contents will be illustrated below.

Figure 2D:
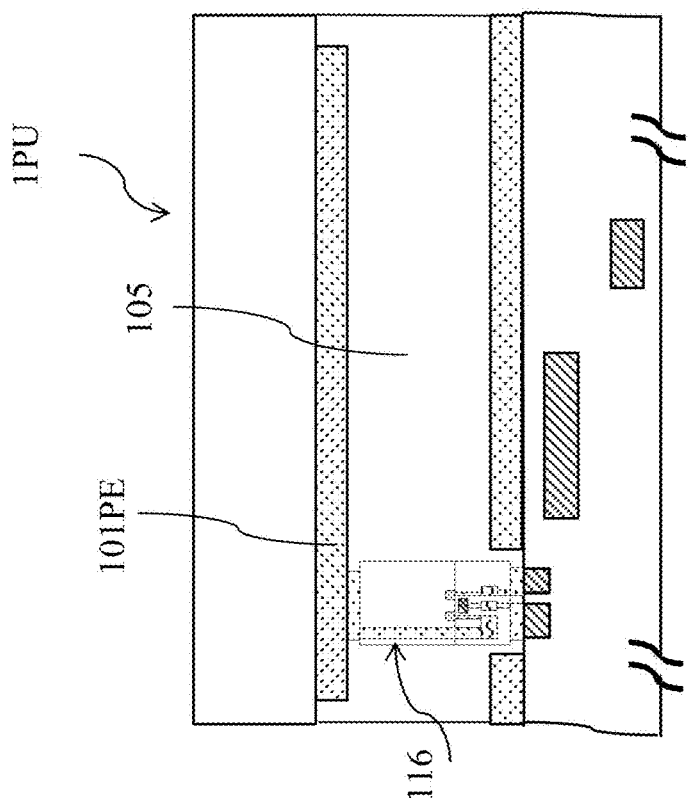
FIG. 2C to FIG. 2F are cross-section views of different constructed pixel units according to different embodiments of the present invention.
Figure 2C:
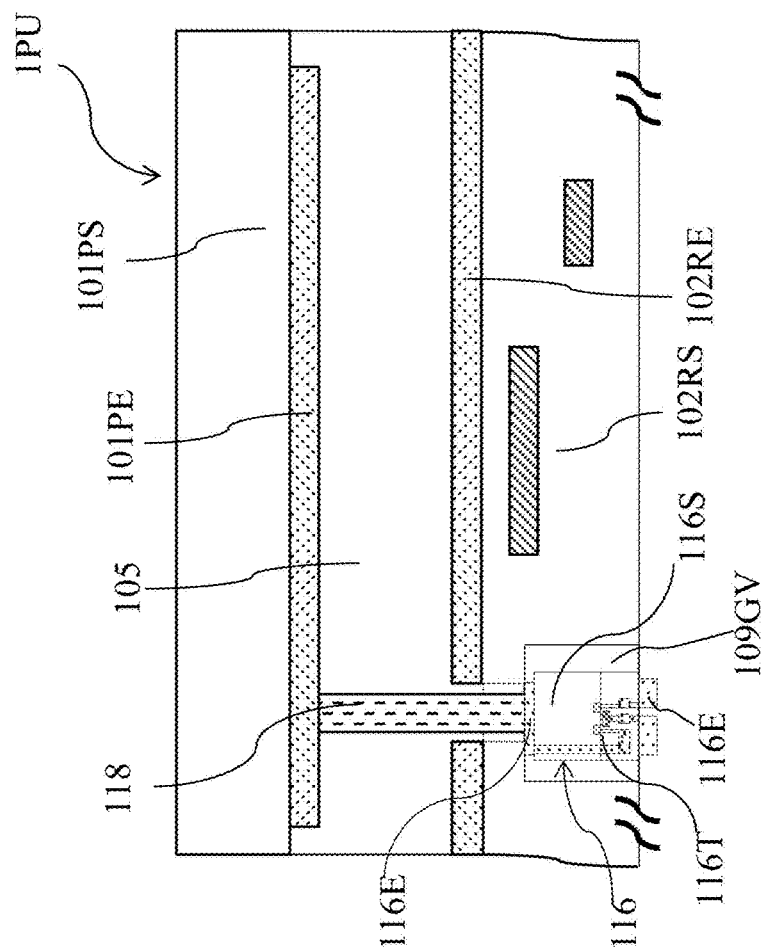
Figure 2F:
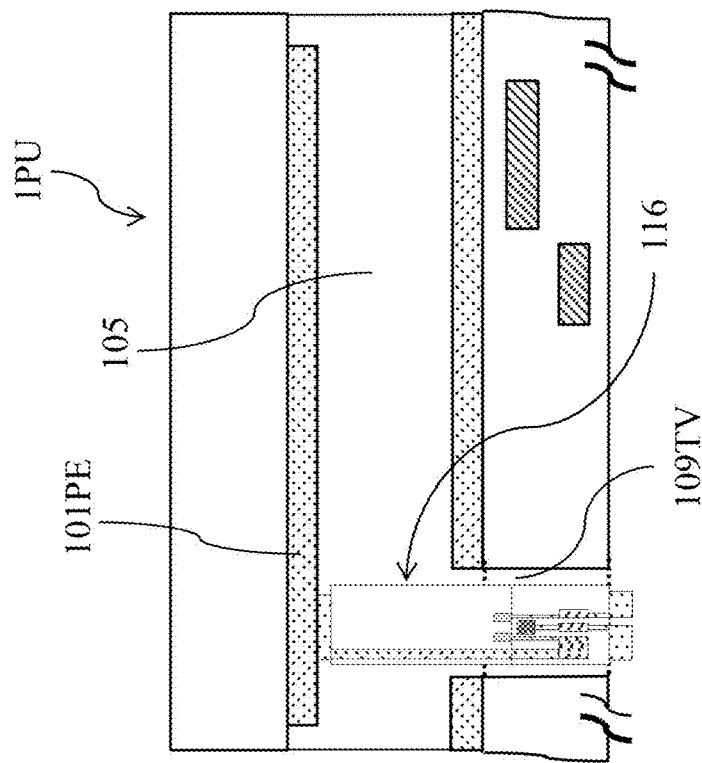
Figure 2E:
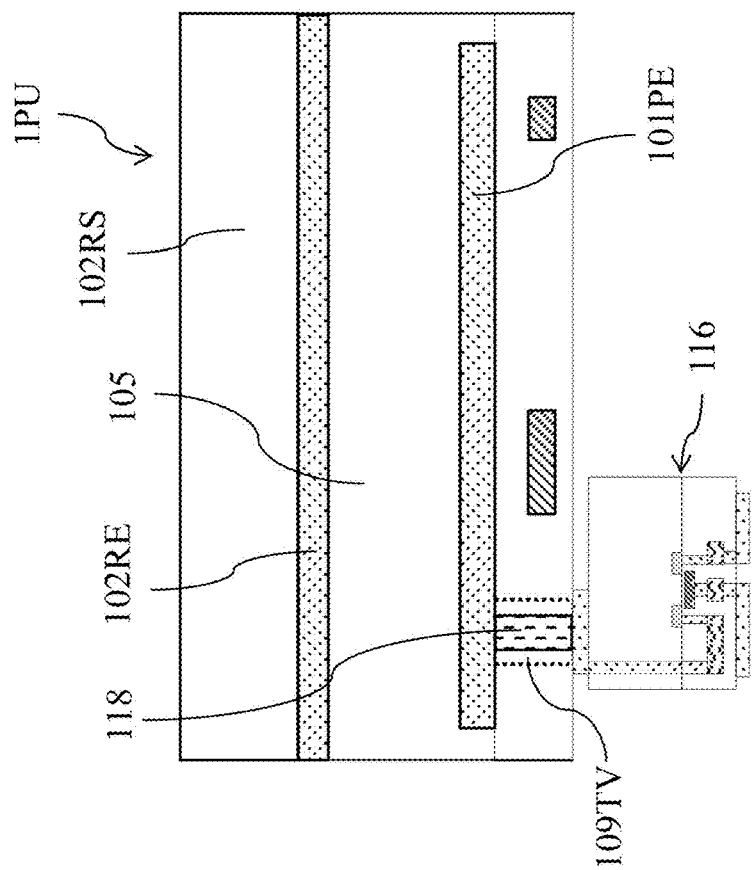

Please refer FIG. 2A to FIG. 2F. FIG. 2B is a cross-section view of the pixel unit along the line 2B-2B' in FIG. 2A. FIG. 2C to FIG. 2F are cross-section views of different constructed pixel units according to different embodiments of the present invention. An active switching element substrate portion 116S and a transistor portion 116T are formed on the active switching element substrate portion 116S. That is, the wafer portion 116T is a part of an active switching element substrate, which may be glass, quartz, metal, metal oxide, silicon, silicon dioxide on insulator, germanium, gallium arsenide, gallium nitride, three-five compound, two-six compound, four-four compound, four-four alloy, amorphous silicon, organic flexibility, inorganic and the combination of the above (silicon wafer is used in the following illustrations), and the transistor portion 116T is formed by a series of semiconductor processes (exposure, development, etching, diffusion, deposition, ion implantation, cleaning, inspection, etc.) on the active switching element substrate. The active switching element substrate may be simultaneously formed with a plurality of the transistor parts 116T, and then the active switching element substrate may be divided into a plurality of portions (with each part including one or more transistor portions 116T) by a cutting process, and each part is the active switching element 116 described above. In addition, the active switching element 116 may further include a plurality of electric conductors and a plurality of electrodes 116E formed on and/or in the upper and lower surfaces of the active element switch substrate portion 116S and/or the transistor portion 116T. The source, the gate, and the drain of the transistor portion 116T may be electrically connected to each other. The active switching element 116 may also be regarded as a chip or die.

The display medium module 1U comprises at least one pair of electrodes and a display medium 105. The pair of electrodes includes a first electrode 101PE and a second electrode 102RE, and the first electrode 101PE and the second electrode 102RE are separated from each other and may face each other. The display medium 105 is disposed between the first electrode 101PE and the second electrode 102RE. The first electrode 101PE and the second electrode 102RE may also be referred to as a pixel electrode and a pixel corresponding electrode, and may be a non-transparent, partially transparent and/or transparent electrode (e.g. formed of a metal oxide, a nano silver wire, a conductive polymer, carbon nanotubes and graphene). Electrical energy may be imposed on the first electrode 101PE and the second electrode 102RE to change the magnitude and/or the direction of the voltage, current, inductance, capacitance, electrical field, and magnetic field between the first electrode 101PE and the second electrode 102RE and one of the combinations thereof.

The first electrode 101PE may also be electrically connected to the active switching element 116 (e.g. via the electrode 116E of the active switching element 116 and/or another set of electrical conductors 118). The active switching element 116 may control whether electrical energy is to be imposed on the first electrode 101PE and/or the second electrode 102RE.

The display medium 105 may also be called light modulation medium. Its state may be changed via the first electrode 101PE and the second electrode 102RE to control the amount of light passing through (or modulate the properties of light). Specifically, the active switching element 116 may control the electrical energy imposed on the first electrode 101PE and/or the second electrode 102RE, causing the voltage, current and electric field and so on between the first electrode 101PE and the second electrode 102RE to change, which causes the state of the display medium 105 to change. In the case of a display medium 105 made of non-self-luminous liquid crystal, change in the state of the display medium 105 means torsional rearrangement of the liquid crystal molecules. In the case of a display medium 105 made of self-luminous organic light-emitting diode, change in the state of the display medium 105 means by the applied electric field magnitude to move the carriers for inducing the electrons and the holes carrier recombination phenomenon, to produce light intensity and color. The type of the display medium 105 is relevant to the configuration of the first electrode 101PE and the second electrode 102RE. For example, if the display medium 105 is in-plane-switching liquid crystal, the first electrode 101PE and the second electrode 102RE may be arranged on the same plane.

Besides non-self-luminous and self-luminous medium materials, in other embodiments the display medium 105 may further comprise color filter material, conductive material, insulating material, light absorbing material, light reflecting material, photo refractive material, light deflecting material, light diffusing material and at least one of the foregoing materials (the foregoing materials may be formed on the first substrate 101PS and/or the second substrate 102RS described below, or may be formed into a plate body before being disposed on the surfaces of the first substrate 101PS and/or the second substrate 102RS). Wherein non-self-luminous medium materials may include at least one of electrophoretic material, electric fluid material, liquid crystal material, micro electromechanical reflective material, electrowetting material, electric ink material, magnetic fluid material, electrochromic material, electromorphous material and thermochromic material. Self-luminous medium materials may include at least one of electroluminescent material, photoluminescent material, cathodoluminescent material, field emissive luminescent material, phosphorescent material, fluorescent material and light-emitting diode material for producing white, Green, blue, orange, indigo, purple, yellow or combinations thereof.

The display medium module 1U may also include a first substrate 101PS and/or a second substrate 102RS, which are disposed facing each other and separate from each other and are used for supporting the first electrode 101PE, a second electrode 102RE and/or a display medium 105. The first electrode 101PE may be disposed on the first substrate 101PS, the second electrode 102RE may be disposed on the first substrate 101PS and/or the second substrate 102RS (depending on the type of the display medium 105), and the display medium 105 may be disposed between the first substrate 101PS and the second substrate 102RS (or, when the display medium module 1U comprises only one of the first substrate 101PS and the second substrate 102RS, the display medium 105 may be disposed on the first substrate 101PS and the second substrate 102RS). The active switching element 116 may be disposed on the first substrate 101PS and/or the second substrate 102RS, but not directly manufactured on the first substrate 101PS and/or the second substrate 102RS; that is, the active switching element 116 is independent after separately manufactured before being assembled to the first substrate 101PS and/or the second substrate 102RS. Further, the active switching element 116 may be disposed on one of the upper and lower surfaces, the inside, the groove 109GV, the perforation 109TV, and the combination of the first substrate 101PS and/or the second substrate 102RS, so that the pixel aperture ratio of the first electrode 101PE is less compressed by the active switching element 116.

The first substrate 101PS, the second substrate 102RS, the first electrode 101PE, and/or the second electrode 102RE may be made of (but not limited to) the following materials: transparent material, opaque material, flexible material, rigid material, metallic material, ceramic material, insulating material, metal compound material, metal alloy material, organic material, inorganic material, composite material, semiconductor material and one of the combinations thereof. In the present embodiment, the first substrate 101PS and the second substrate 102RS are made of transparent material (such as glass).

The foregoing flexible material may include: polyethylene naphthalate (PEN), polyvinyl chloride (PVC), polyethersulfone (PES), polyethylene terephthalt (PET), polyarylate (PAR), polystyrene (PS), polycarbonate (PC), polyimide (PI), polymethyl methacrylate (PMMA), polyacrylonitrile (PAN), polyamide (PA) and one of the combinations thereof.

The pixel unit 1PU may also include a control signal line 1G and a data signal line 1D, which may be formed on or in the surface of the first substrate 101PS and/or the second substrate 102RS and electrically connected to the active switching element 116 (e.g. via the electrode 116E of the active switching element 116). The on and off of the active switching element 116 may be controlled via the control signal line 1G, and electrical energy (i.e. pixel content, which is represented in the form of voltage or electric current) may optionally be transmitted to the active switching element 116 via the data signal line 1D and be further imposed on the first electrode 101PE. The control signal line 1G, the data signal line 1D, the first electrode 101PE, and/or the second electrode 102RE may be located in the same horizontal layer or different horizontal layer of the first substrate 101PS and/or the second substrate 102RS.

Further, the control signal line 1G, data signal line 1D, first electrode 101PE and/or second electrode 102RE may be made of (but not limited to) the following materials: transparent conductive material, non-transparent conductive material, flexible conductive material, rigid conductive material, metallic conductive material, metal compound material, metal alloy material, organic conductive material, inorganic conductive material, and composite conductive material, and one of the combinations thereof.

As illustrated above, the active switching element 116 is fabricated from the active switching element substrate, rather than directly on a part of the display medium module 1U. Therefore, the manufacturing of the active switching element 116 is not restricted by the characteristics of the display medium module 1U itself. In addition, when the active switching element 116 can be optimized during the manufacturing process, and used a matured process technology to have better characteristics (e.g., critical voltage, current driving capacity and other uniformity).

Further, it has been noted above that described multimedia device having a display function may include a plurality of pixel units 1PU. In this type of configuration, the first substrate 101PS of the first of the display medium modules 1U of the pixel units 1PU may be connected and integrated and so may the second substrate 102RE. One of the first electrode 101PE and the second electrode 102RE may also be connected and integrated to serve as a pixel corresponding electrode.

The foregoing description illustrates the technical content of a pixel unit 1PU according to the present embodiment. The technical content of pixel units 1A according to other embodiments of the present invention is described below. The technical content of the pixel unit in each of these embodiments may be cross-referenced, so identical description is omitted or simplified.

Figure 3A:
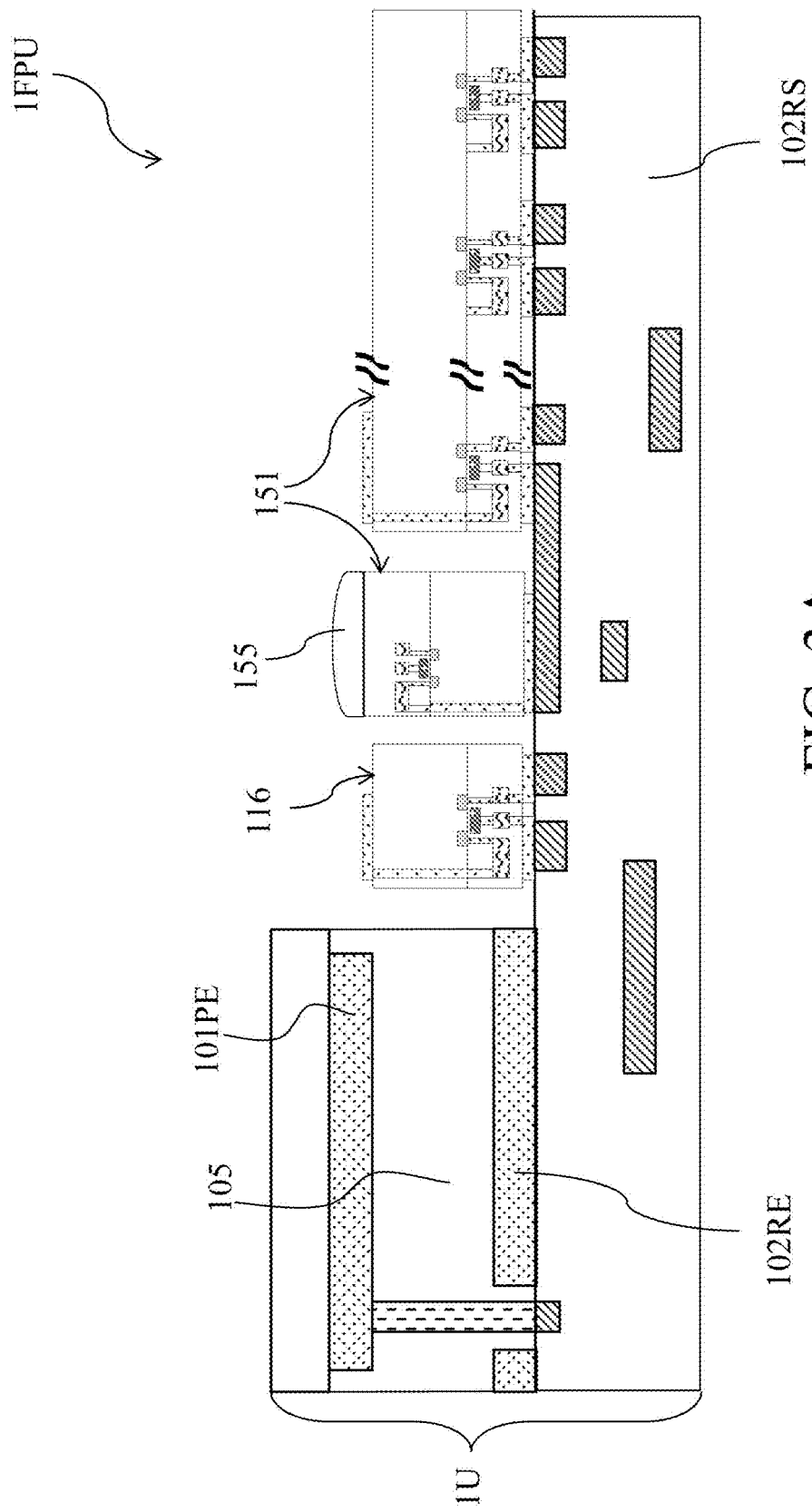
FIG. 3A to FIG. 3C are cross-section views of another pixel unit according to another embodiment of the present invention.
Figure 3B:
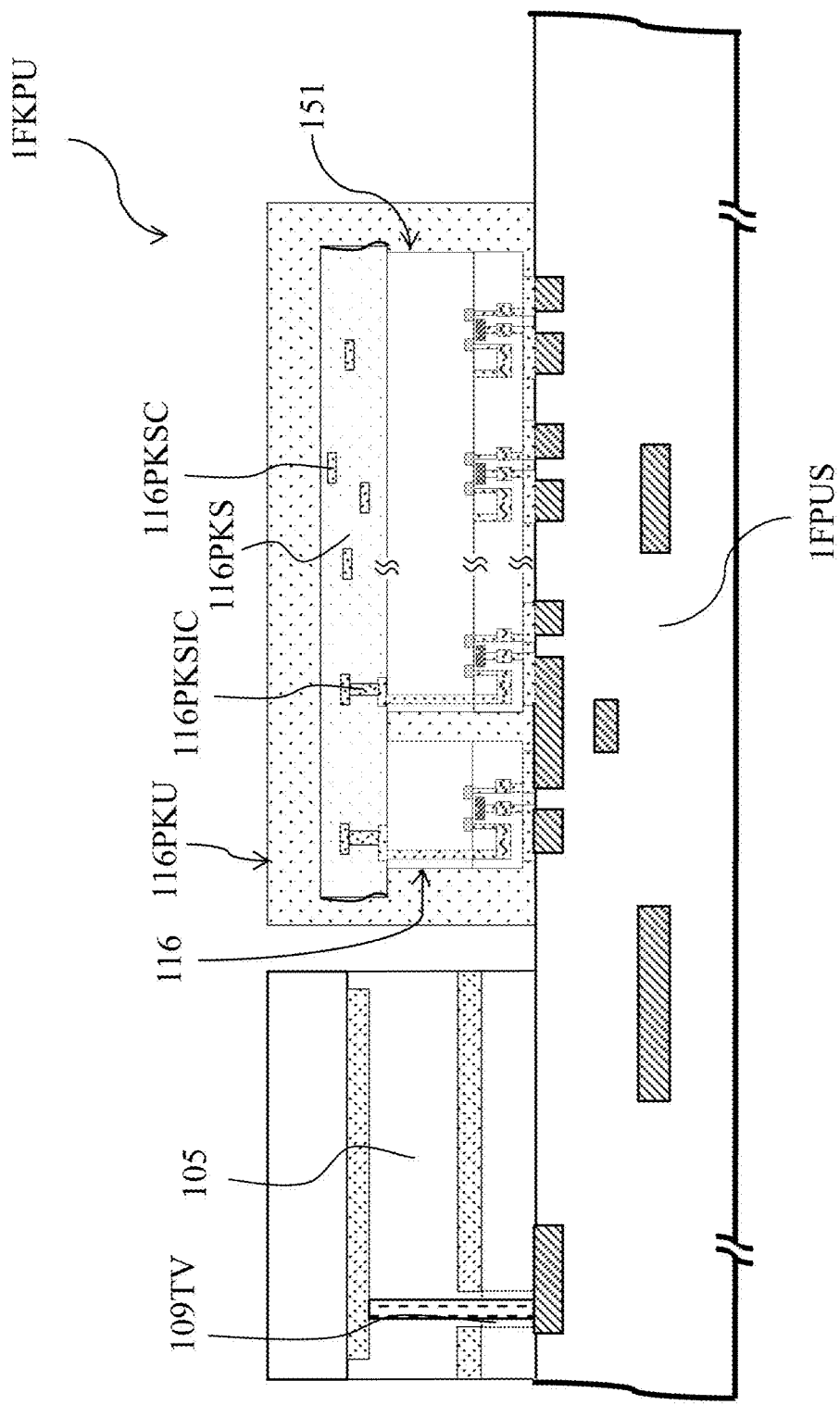
Figure 3C:
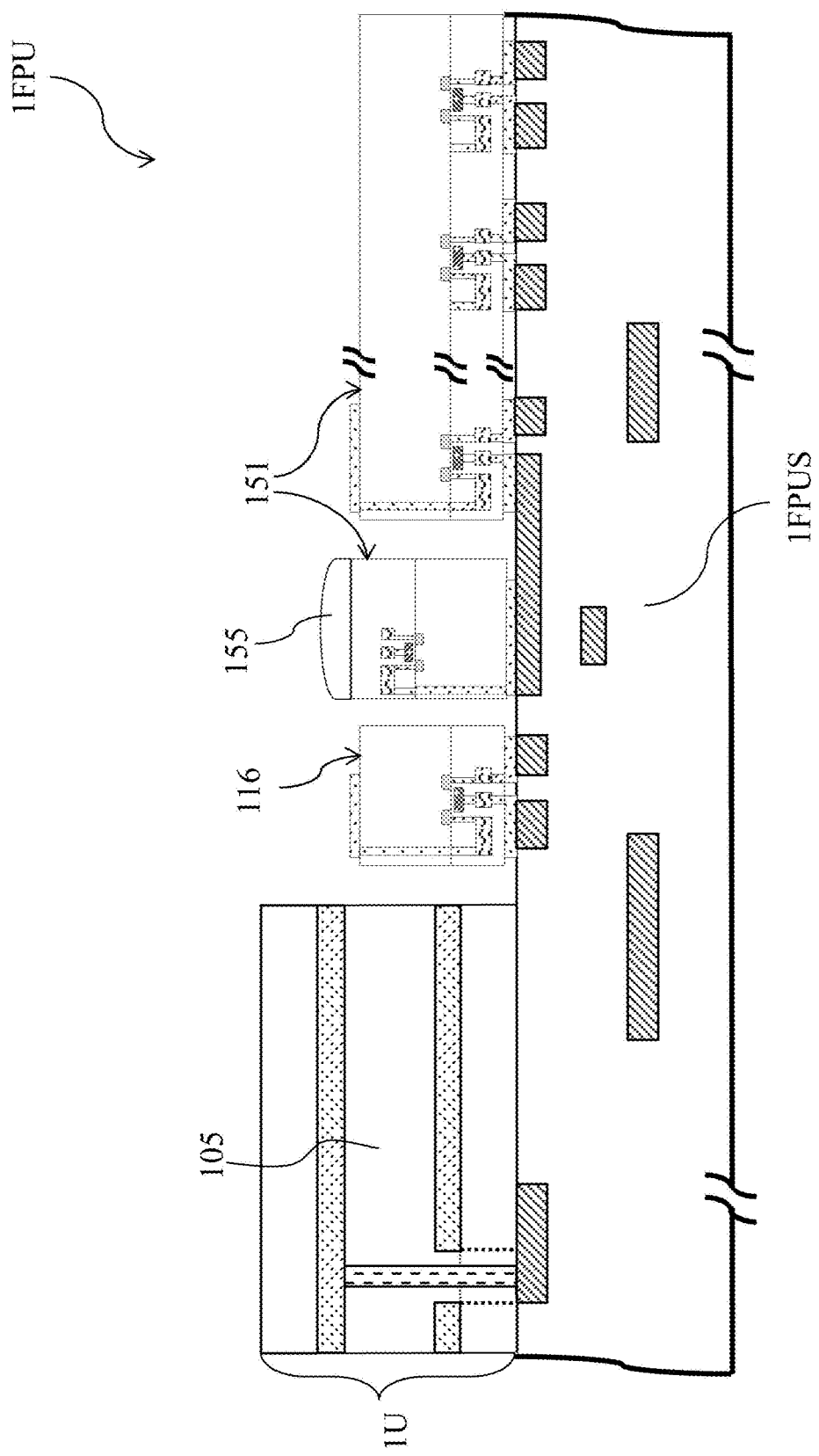

Please refer to FIG. 3A to FIG. 3C, showing a cross-section view of a pixel unit 1FPU according to another embodiment of the present invention. The pixel unit 1FPU is similar to the pixel unit 1PU, both including an active switching element 116 and a display medium module 1U. The pixel unit 1FPU further comprises one or a plurality of functional elements 151 (a plurality of functional elements 151 are employed as an example in the present embodiment).

The plurality of functional elements 151 are electronic elements each having (but not limited to) a specific function, for example: one of a touch sensing functional element, a displacement sensing functional element, a pressure sensing function, a hygrothermal sensing functional element, an acoustic sensing functional element, an electromagnetic sensing functional element, an image capturing functional element, a memory functional element, a control functional element, a wireless communication functional element, a self-luminous functional element, a passive functional element (inductor, resistor, capacitor or a combination thereof) and a photovoltaic functional element. The pixel unit 1FPU may comprise one or a plurality of optical elements 155 corresponding to the optically related functional elements 151 (e.g., image capture function elements). The optical element 155 may comprise at least one of a convex lens, a concave lens and an optical prism for changing the direction of ambient light illumination to be received by the functional elements 151.

The touch sensing functional element may include: one of a photo-sensing element, a piezoelectric sensing element, a capacitance sensing element, a resistance sensing element, an inductance sensing element, an electromagnetic sensing element, an electric charge sensing element, a voltage sensing element, a current sensing element, a pressure sensing element and an acoustic sensing element.

The plurality of functional elements 151 may be disposed on the first substrate 101PS and/or the second substrate 102RS, but not directly formed on some portion of the display medium module 1U. That is, the functional elements 151 are manufactured before being assembled on the display medium module 1U. Therefore, the functional elements 151 can also be manufactured independently without the restriction from the characteristics of the display medium module 1U. The functional elements 151 may be electrically connected to the active switching element 116, the control signal line 1G, or the data signal line 1D (or the pixel unit 1FPU may include other signal lines or electrodes for electrically connecting to the functional elements 151) for achieving the controlling functions of the functional elements 151, being controlled by the functional elements 151, transmitting signals to the functional elements 151, or receiving signals from the functional elements 151, and so on.

With the functional elements 151, the pixel unit 1FPU may provide other functions besides image display (display, touch, sensing, photography, data transmission, power generation, and so on). For example, an image capturing functional element may enable the pixel unit 1FPU to capture part of an image; a memory functional element may record the state of the pixel medium 105 or the data of the recording function element 151 itself; a control functional element may control the active switching element 151; a wireless communication functional element may directly transmit the pixel content or the data of various functional elements, and wirelessly transmit and receive data from the wireless control module 33 (refer FIG. 6) of the multimedia device (which will be further described in the embodiments below); a photovoltaic functional element may convert ambient light illumination into electrical power, and so on.

Please refer to FIG. 3B, showing another cross-section view of a pixel unit 1FKPU according to another embodiment of the present invention. The pixel unit 1FKPU may optionally further include a package carrier 116PKU, therein may be packaged an active switching element 116 and/or functional elements 151 before the package carrier 116FKU is assembled to the display medium module 1U. That is, when the active switching element 116 or the functional element 151 is manufactured from the active switching element substrate, That is, after the active switching element 116 or the functional element 151, they may be first packaged in a package carrier 116FKU before being assembled or directly assembled by a carrier plate of the pixel unit 1FKPU to the display medium module 1U. The active switching element 116 and functional elements 151 may be manufactured on a same active switching element substrate, (or on different substrate) and then packaged together in the package carrier 116FKU. The package carrier 116PKU may protect the active switching element 116 and functional elements 151 and may facilitate the process of assembling them to the display medium module 1U.

The manufacture material of the package carrier 116PKU may include (but not limited to): semiconductor material, conductive material, insulating material, organic material, inorganic material, metallic material, metallic alloy material, ceramic material, compound material, transparent material, opaque material, flexible material, rigid material, non-metallic material, and one of the combinations thereof. The package carrier 116PKU may also include a substrate 116PKS, a conductive line, a conductive connecting pad 116PKSC, a conductive connecting pole 116PKSIC, a conductive connecting bump, a conductive connecting joint, an insulating medium layer, an insulating medium, an adhesive medium, a connecting wire, or a combination thereof, and so on.

Figure 4A:
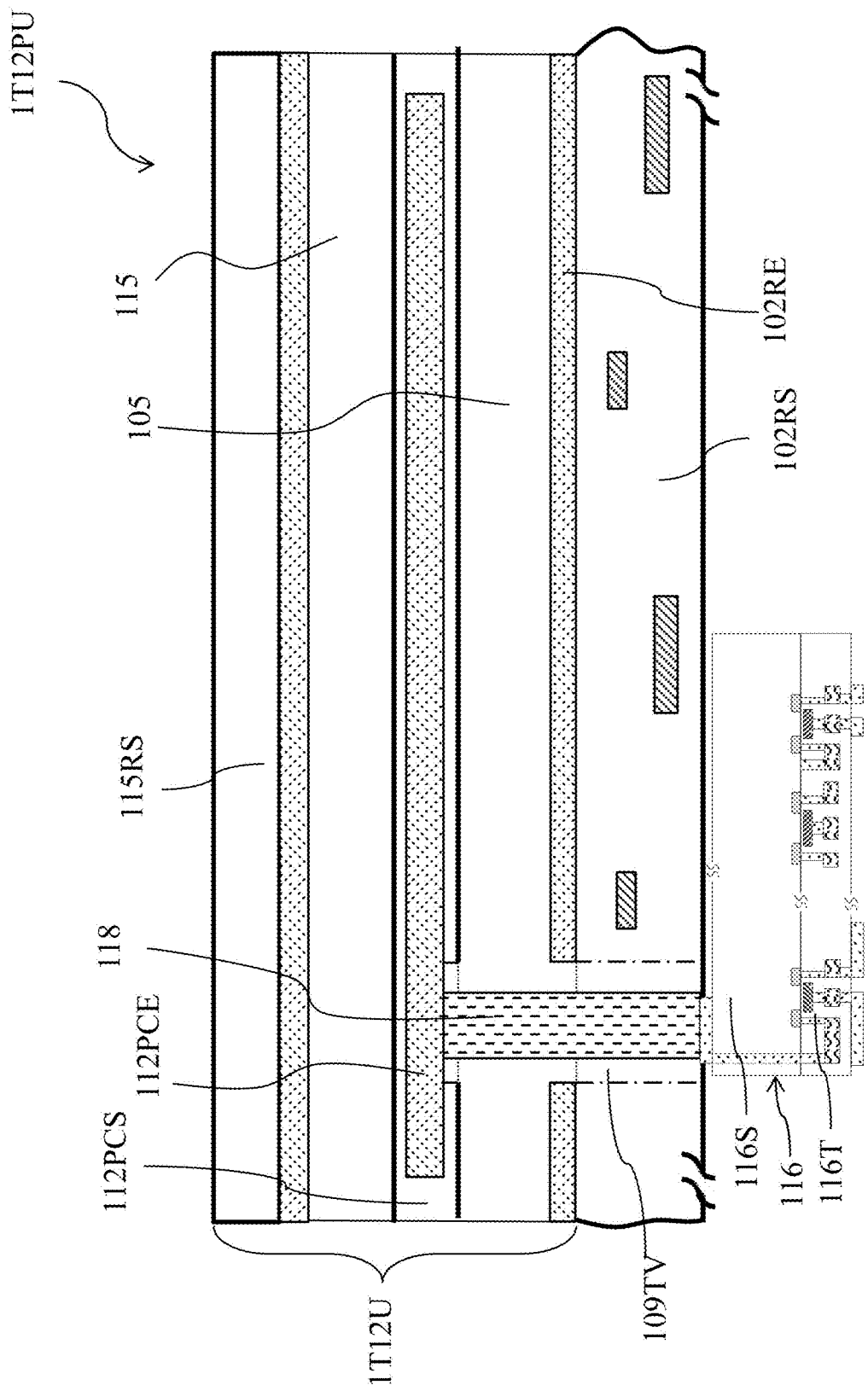
FIG. 4A to FIG. 4C are cross-section views of a pixel unit according to another embodiment of the present invention.
Figure 4B:
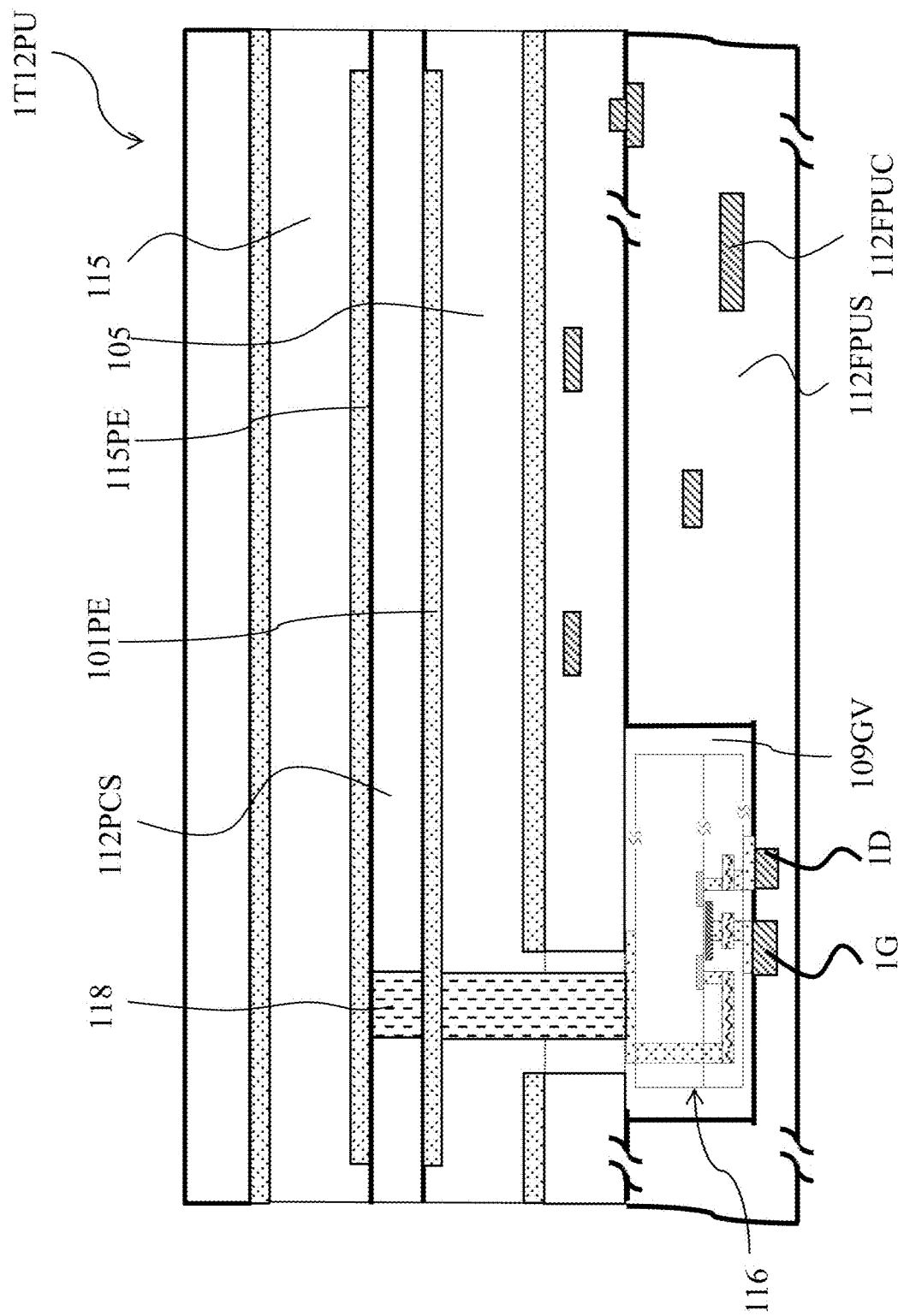
Figure 4C:
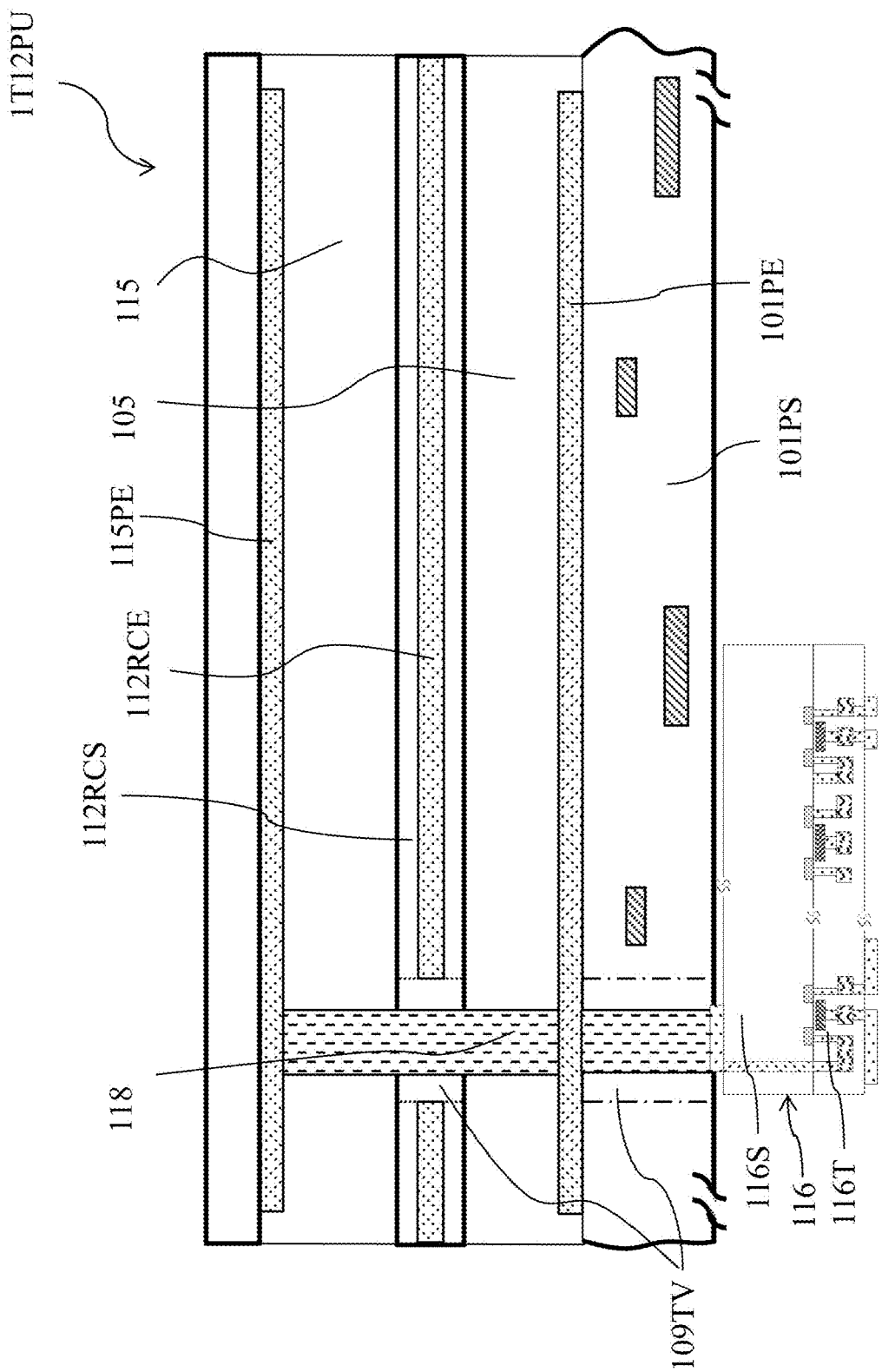

Please refer to FIGS. 4A to 4C, showing a cross-section view of a pixel unit 1T12PU according to another embodiment of the present invention. The pixel unit 1T12PU is similar to the pixel unit 1PU, and includes the active switching element 116, and further includes a display medium module 1T12U (only two display media as an example) having a plurality of display media, a carrier board 112FPUS, a pixel unit common substrate 112PCS and/or a pixel corresponding common substrate 112RCS; furthermore, the first substrate 101PS of a pixel unit 1T12PU, a pixel unit common substrate 112PCS, a pixel corresponding common substrate 112RCS and/or the substrate 102RS may include a perforation 109TV and/or a groove 109GV.

Specifically, the carrier board 112FPUS may allow the display medium module 1T12U to be disposed thereon, and the active switching element 116 may be mounted on the carrier board 112FPUS; The carrier board 112FPUS may also include a circuit conductive pad 112FPUC, a wire line, and other elements for the display medium module 1T12U and the active switching element 116 to be electrically connected to each other. The control signal line 1G and the data signal line 1D may also be formed on the carrier board 112FPUS and electrically connected to the active switching element 116.

Further, the carrier board 112FPUS may include a concave groove 109GV (or perforation 109TV). The first substrate 101PS of the display medium module 1T12U, the pixel unit common substrate 112PCS, the pixel correspondence common substrate 112RCS, and/or the second substrate 102RS may also include a perforation 109TV, and then the active switching element 116 may be disposed in the concave groove 109GV, is electrically connected to the first electrode 101PE, the pixel unit common electrode 112PCE, the pixel corresponding common electrode 112RCE, and/or the second electrode 102RE by a conductor 118 disposed in the perforation 109TV. The concave groove 109GV in the carrier board 112FPUS may also comprise a sidewall insulating layer, a conductive wire, a conductive pad, a conductor, an insulating medium, or a combination thereof, enabling the active switching element 116 to be electrically connected or isolated from other elements. The disposition of the carrier board 112FPUS facilitates the electrical connection arrangement easier among the elements of the pixel unit 1T12PU, particularly when the pixel unit 1T12PU comprises a plurality of functional elements.

Figure 5:
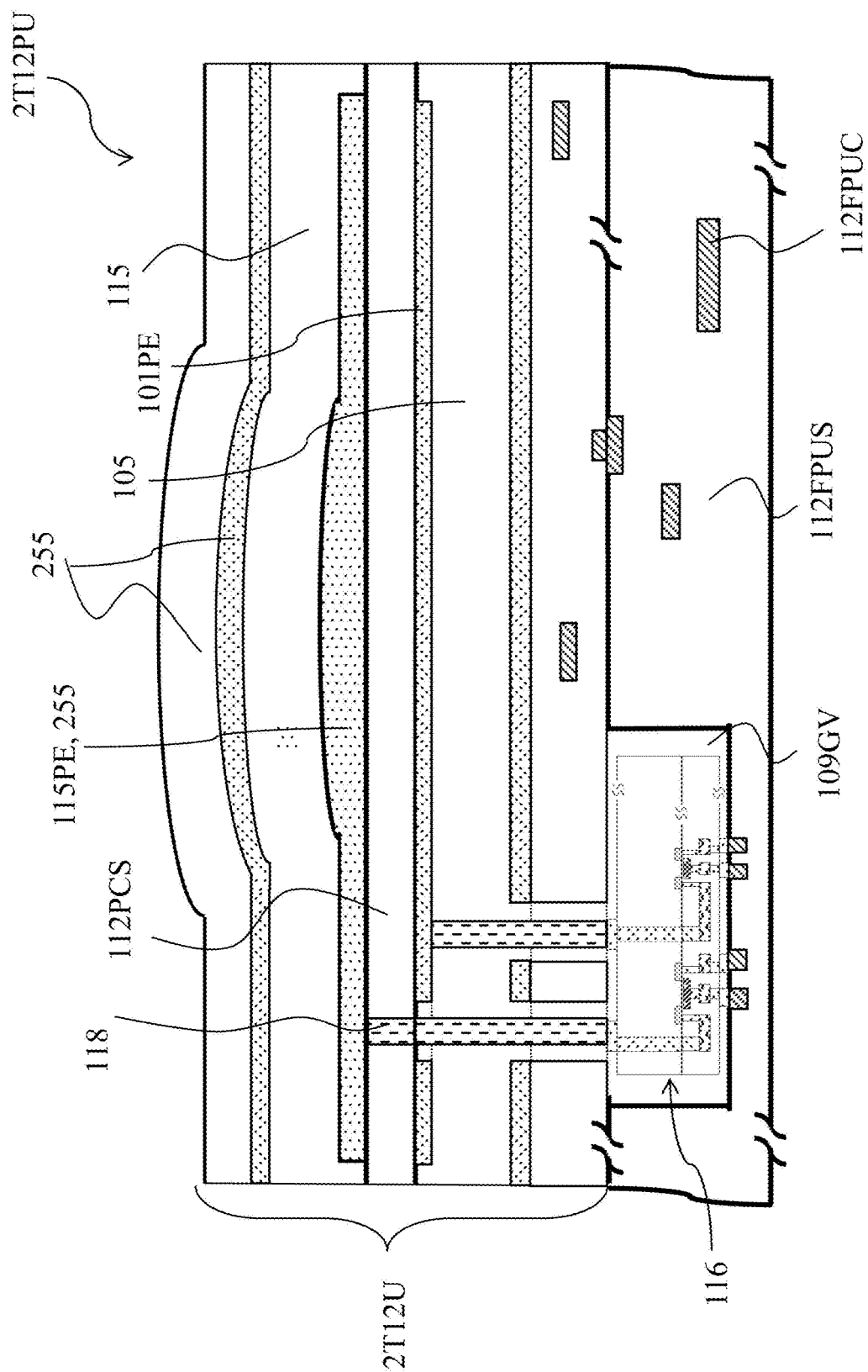
FIG. 5 is a cross-section view of a pixel unit according to another embodiment of the present invention.

Please refer to FIG. 5, showing cross-section views of a pixel unit 2T12PU according to another embodiment of the present invention. The pixel unit 2T12PU (only two pixel display media is shown as an example) is similar to the pixel unit 1T12PU, except the transistor portion 116T in the active switching element 116 of the pixel unit 2T12PU may have two independent transistors switching elements, which can control the contents of the individual pixel electrodes simultaneously or asynchronously.

The pixel unit 2T12PU is similar to the pixel unit 1T12PU described above, and may include an optical element 255 formed in the display medium module 2T12U or the above-described display medium module 1T12: for example, disposed on the first electrode 115PE, the first electrode 101PE, the pixel unit common electrode 112PCE, the pixel corresponding common electrode 112RCE, and/or the second electrode 102RE (or directly the first electrode 115PE, the first electrode 101PE, the pixel unit common electrode 112PCE, the pixel corresponding common electrode 112RCE and/or the second electrode 102RE are configured as the optical element 255), and optically coupled to the display medium module 2T12U or the aforementioned display medium module 1T12U. As such, the optical element 255 may direct ambient light into the display media module 2T12U and/or 1T12U, and the quantity or characteristic of the light can be controlled by the display medium 105 and/or the display medium 115 to enter or exit the display media module 2T12U or 1T12U. When the ambient light is enough, the pixel unit 2T12U and/or 1T12U can directly use the ambient light to achieve the image pixel display or light adjustment function. The optical element 255 may comprise at least one of a convex lens, a concave lens, and an optical prism.

Figure 6:
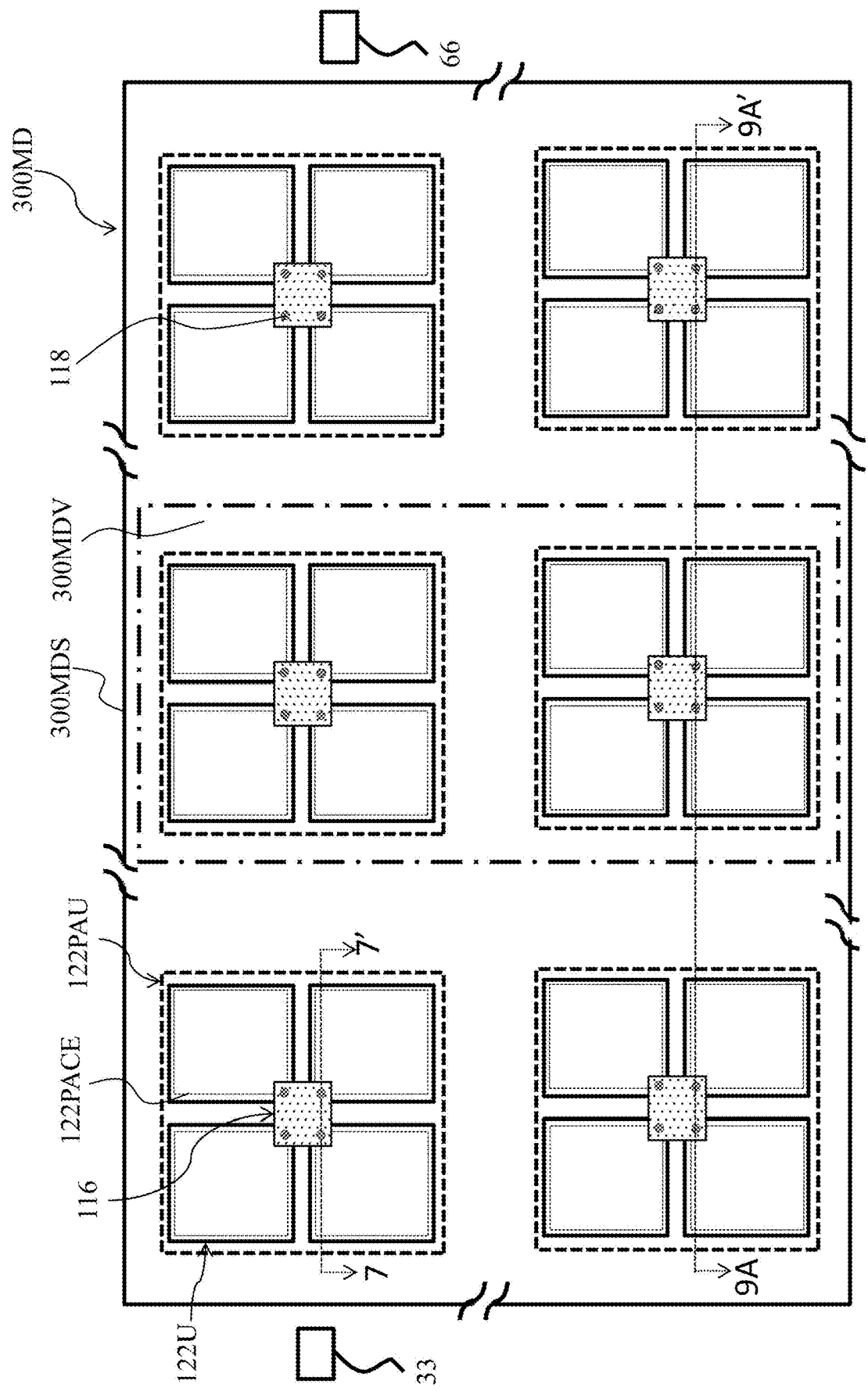
FIG. 6 is a top view of a multimedia device according to another embodiment of the present invention.

Please refer to FIG. 6, showing a top view of a multimedia device 300MD according to another embodiment of the present invention. The multimedia device 300MD can be accomplished as a device having a display and/or a voice function, and the multimedia device 300MD comprises abovementioned a pixel array 122PAU, a multimedia substrate 300MDS, and a magnetic substrate 300MMS (refer FIG. 9A). Wherein the pixel array 122PAU is separately assembled to the multimedia substrate 300MDS, and includes an active switching element 116 and further includes a display medium module 122U having a plurality of pixel units and display media (only two pixel units and display media is shown as an example), In addition, a plurality of magnetic induction portions 300MGL (refer FIG. 9A conductive circuit patterns) may be formed in the multimedia substrate 300MDS, and at least one cavity portion 300MDV (refer FIG. 9A) formed on the lower surface of the multimedia substrate 300MDS, and the cavity portion 300MDV is relatively located below the magnetic induction portion 300MGL. Furthermore, the magnetic induction unit 300MGL may be electrically connected to the active switching element 116 of the pixel array 122PAU for controlling the current magnitude, speed and direction etc. to cause the multimedia substrate 300MDS and the magnetic substrate 300MMS producing an attraction or rejection force from different magnitude and speed, generating vibrations of different sounds from the magnetic substrate 300MMS and/ or the multimedia substrate 300MDS, and matching an image shown on the pixel array 122PAU can be used as a multimedia device having a loudness function and a lightness.

Figure 7:
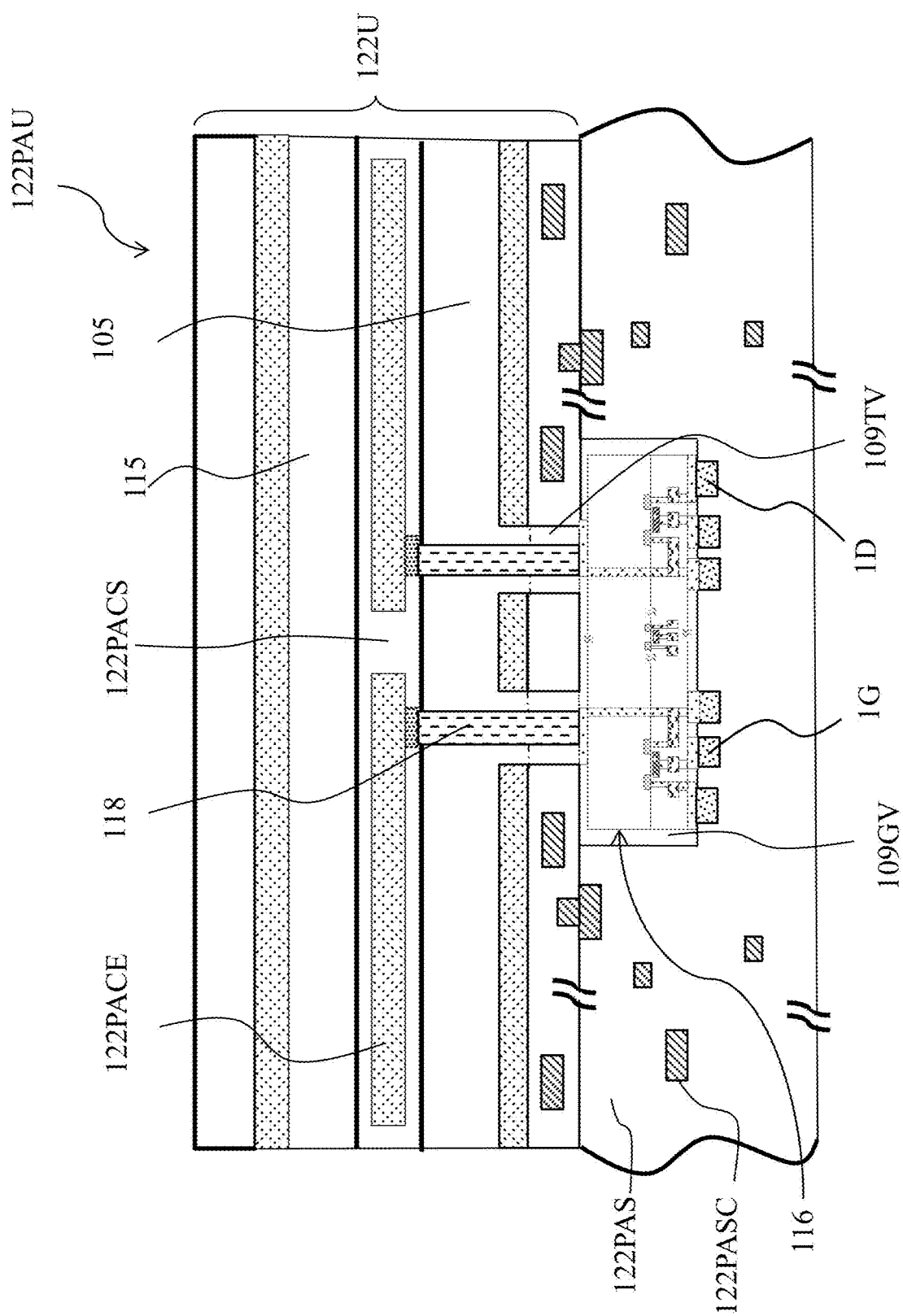
FIG. 7 is a cross-section view of a pixel array according to another embodiment of the present invention along the line 7-7' in FIG. 6.

Please refer FIG. 7, showing a cross-section view of the pixel array 122PAU according to another embodiment of the present invention along the line 7-7' in FIG. 6. The pixel array 122PAU includes a plurality of pixel units similar to the pixel units 1T12PU, 2T12PU, 1FPU, 1PU, etc., and includes an active switching elements 116, and further includes a display medium module having a plurality of pixel units and a display medium 122U (only two pixel units and display media are shown as examples), a pixel array carrier board 122PAS and a pixel array common substrate 122PACS and/or a pixel corresponding common substrate, a corresponding common substrate 122PACS and/or a pixel. Furthermore, the transistor portion 116T among the active switching elements 116 of the pixel array 122PAU may have two independent transistor switching elements for controlling the display media of the respective pixel units (the contents of the pixel units and/or the pixel unit common electrodes are controlled in a synchronous or asynchronous manner, respectively).

Specifically, the pixel array carrier board 122PAS is provided for the display medium module 122U to dispose on it, and the active switching element 116 may be disposed on the pixel array carrier board 122PAS; the pixel array carrier board 122PAS further comprises a conductive pad 122PASC, a conductive circuit, a control signal line 1G, and a data signal line 1D and so on, so that the display medium module 122U and the active switching element 116 are electrically connected to each other.

On the other hand, the pixel array carrier board 122PAS may comprise a concave groove (or perforation), and then the active switching element 116 may be installed in the concave groove 109GV, is electrically connected to the pixel array common electrode 122PACE (or the aforementioned first electrode or the second electrode) through the perforation 109TV of the first substrate and/or the second substrate of the display medium module 122U, wherein embedded a conductor 118. The concave groove 109GV of the pixel array carrier board 122PAS may still contain a sidewall insulating layer, a conductive line, a conductive pad, a conductor, an insulating medium, or a combination thereof, to enable the active switching element 116 to be electrically connected to other elements or isolated. By the configuration of the pixel array board 122PAS, the electrical connection layout between the elements of the pixel array 122PAU should be easier, especially when the pixel array 122PAU contains the aforementioned plurality of functional elements, particularly when the pixel array 122PAU contains the plurality of functional elements and the package carrier described above, it can be easily integrated into the wired and/or wireless communication data transmission mode, The pixel array carrier board 222PAS (refer FIG. 8) is similar to the functionality provided by the pixel array carrier board 122PAS, and can integrate the active switching element 116, the aforementioned plurality of functional elements and/or the package carrier, etc., in a wired and/or wireless communication transmission mode, The pixel array carrier board 222PAS is similar to the functionality provided by the pixel array carrier board 122PAS, and can integrate the active switching element 116, the aforementioned plurality of functional elements and/or the package carrier, etc., in a wired and/or wireless communication transmission mode, and accomplish controlling the contents of the pixel electrodes and/or the pixel unit common electrode in a synchronous or asynchronous manner.

Figure 8:
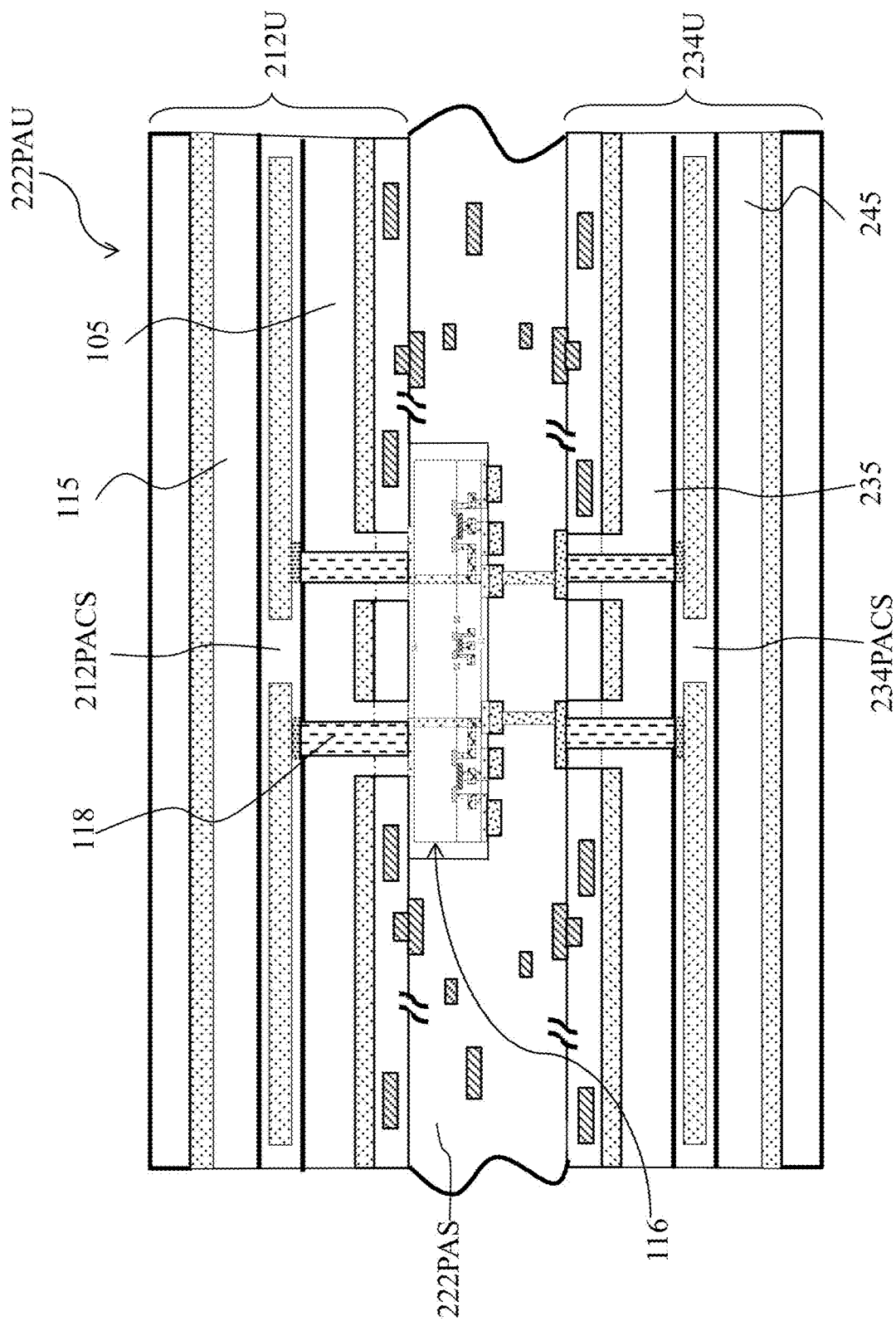
FIG. 8 is a cross-section view of a pixel array according to another embodiment of the present invention.

Please refer to FIG. 8 showing cross-section views of a pixel array 222PAU according to another embodiment of the present invention. The pixel array 222PAU is similar to the pixel array 122PAU, the pixel unit 1T12PU, 2T12PU, 1FPU, 1PU, etc., all including the active switching element 116, and further includes a display medium module 212U and 234U (only a double-sided pixel array is shown as an example)) having a multi-faceted display function module of the pixel array, a pixel array carrier board 222PAS and a pixel array common substrate 212PACS, 234PACS and/or a pixel corresponding to a common substrate. Furthermore, the transistor portion 116T among the active switching elements 116 of the pixel array 222PAU may have two independent transistor switching elements for controlling the display media of the respective pixel units (the contents of the pixel units and/or the pixel unit common electrodes are controlled in a synchronous or asynchronous manner). The pixel array carrier board 222PAS is similar to the functionality provided by the pixel array carrier board 122PAS, and can integrate the active switching element 116, the aforementioned plurality of functional elements and/or the package carrier, etc., in a wired and/or wireless communication transmission mode, and accomplish controlling the contents of the pixel electrodes and/or the pixel unit common electrode in a synchronous or asynchronous manner.

Figure 9A:
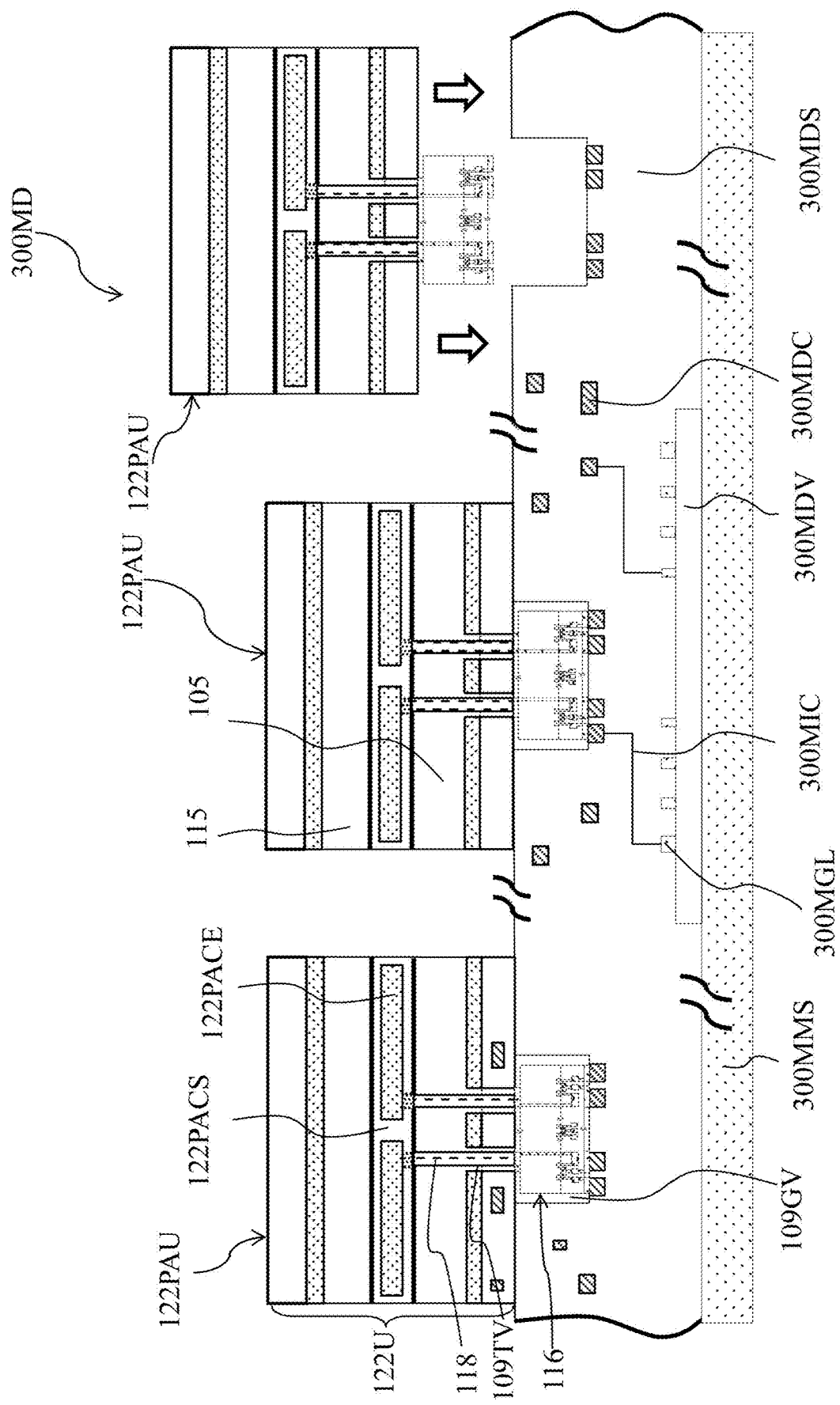
FIG. 9A is a cross-section view of a multimedia device according to another embodiment of the present invention along the line 9A-9A' in FIG. 6.
Figure 9B:
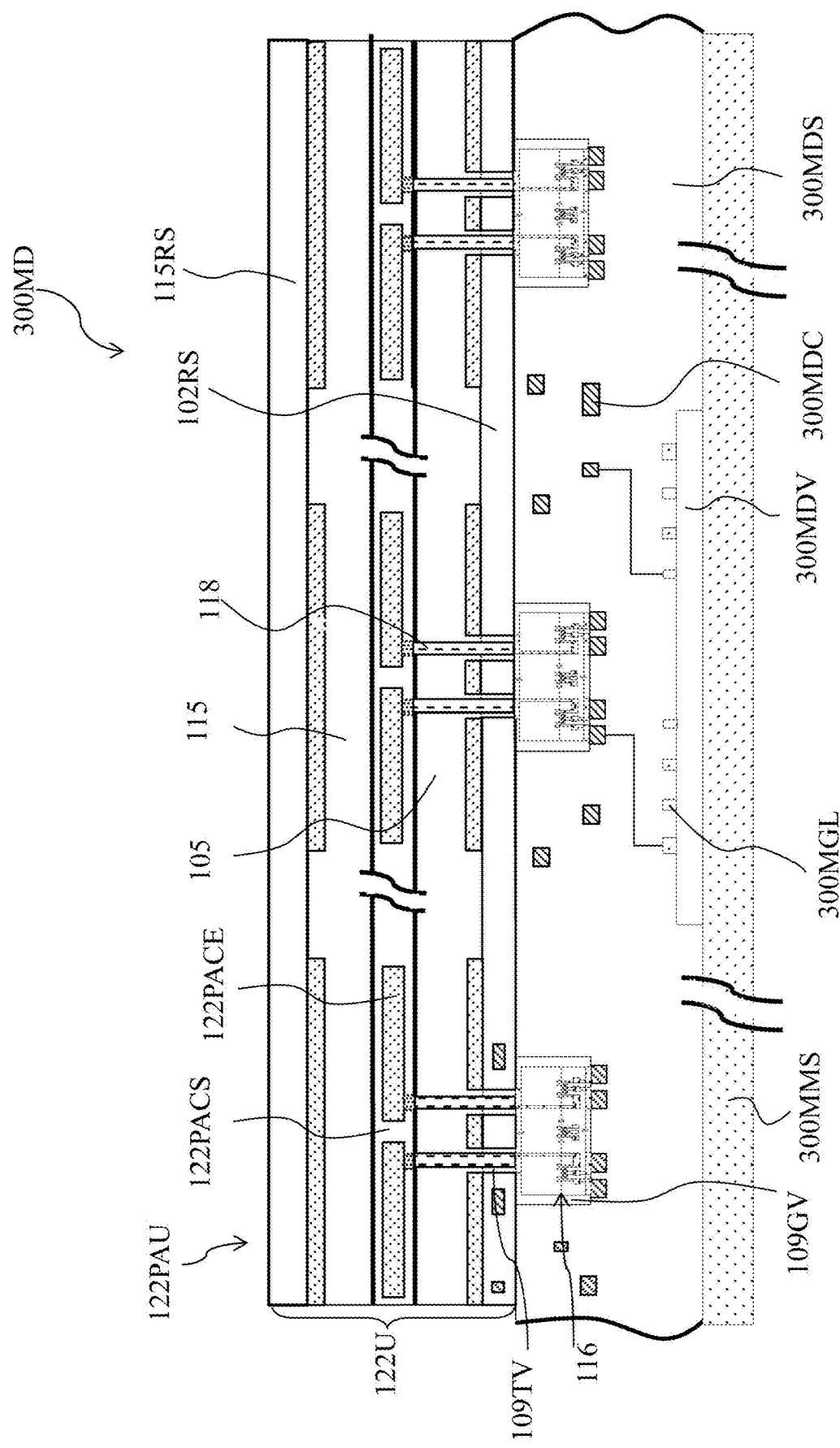
FIG. 9B is a cross-section view of another multimedia device according to another embodiment of the present invention.

Please refer to FIG. 9A and FIG. 9B. FIG. 9A is a cross-section view of a multimedia device according to another embodiment of the present invention along the line 9A-9A' in FIG. 6. FIG. 9B is a cross-section view of another multimedia device according to another embodiment of the present invention. The multimedia device 300MD includes a plurality of pixel arrays 122PAU, a multimedia substrate 300MDS, and a magnetic substrate 300MMS. The multimedia substrate 300MDS may include a concave groove 109GV (or perforation), a magnetic induction 300MGL, a conductive line 300MIC, a conductive pad 300MDC, a conductive post, a conductive bump, a conductive connection, an insulating medium, an adhesive medium or the like one of the combinations, by the foregoing elements on the multimedia substrate 300MDS to cause the electrical connection between the elements of the pixel array 122PAU easier, especially when the pixel array 122PAU contains a plurality of functional elements. Wherein the pixel array 122PAU can be separately assembled into the concave groove 109GV of the multimedia substrate 300MDS, and configured in a separate loading and unloading pattern, i.e., precisely each pixel array 122PAU is not connected to either of the other pixel arrays 122PAU, so that each pixel array 122PAU can be individually removed from the multimedia device 300MD. Thus, when a pixel array 122PAU is damaged, it can be disassembled and then replaced with a normal pixel array 122PAU without the need to replace the entire set of multimedia devices 300MD.

It is to be noted that the multimedia device 300MD of FIG. 9B may include a plurality of pixel arrays 122PAU, and the display medium module 122U of the pixel array 122PAU is integrally connected with each pixel array common substrate 122PACS in the pixel array, and arranged the other pixels correspond common substrate (for example, the second substrate 115RS, 102RS) and the display medium 105, 115 to be connected and integrated. The display medium module 122U of the plurality of pixel arrays can be integrally formed, and the active switching element 116 assembled in such a manner that the pixel array 122PAU (localized) having mostly flexible display resolution constructed and assembled the localized pixel array 122PAU on a multimedia substrate 300MDS and electrically connected a variety of conductive signal line elements thereon, for completing a multimedia device having any resolution.

Figure 10A:
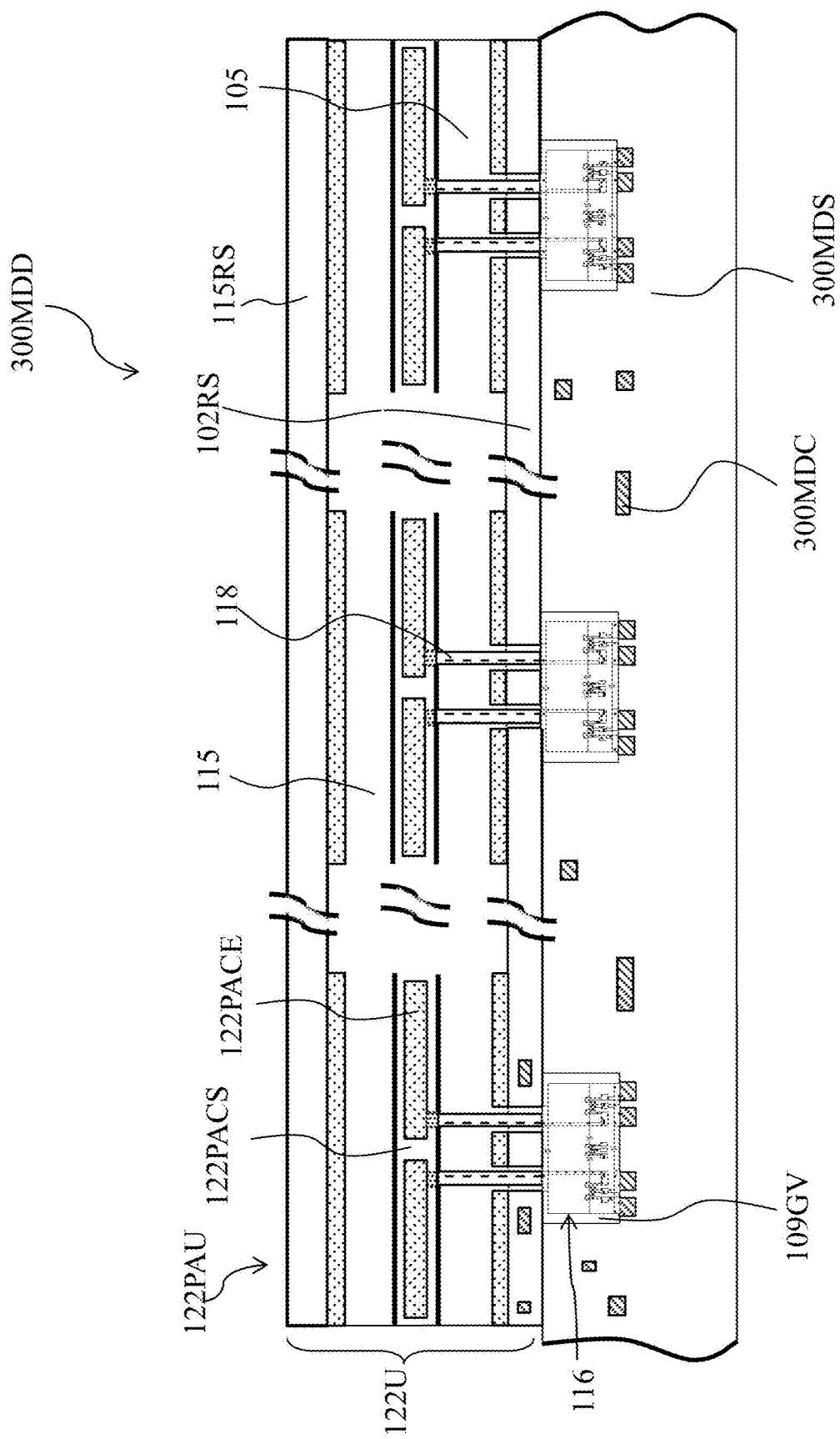
FIG. 10A and FIG. 10B are cross-section views of another multimedia device according to another embodiment of the present invention.
Figure 10B:
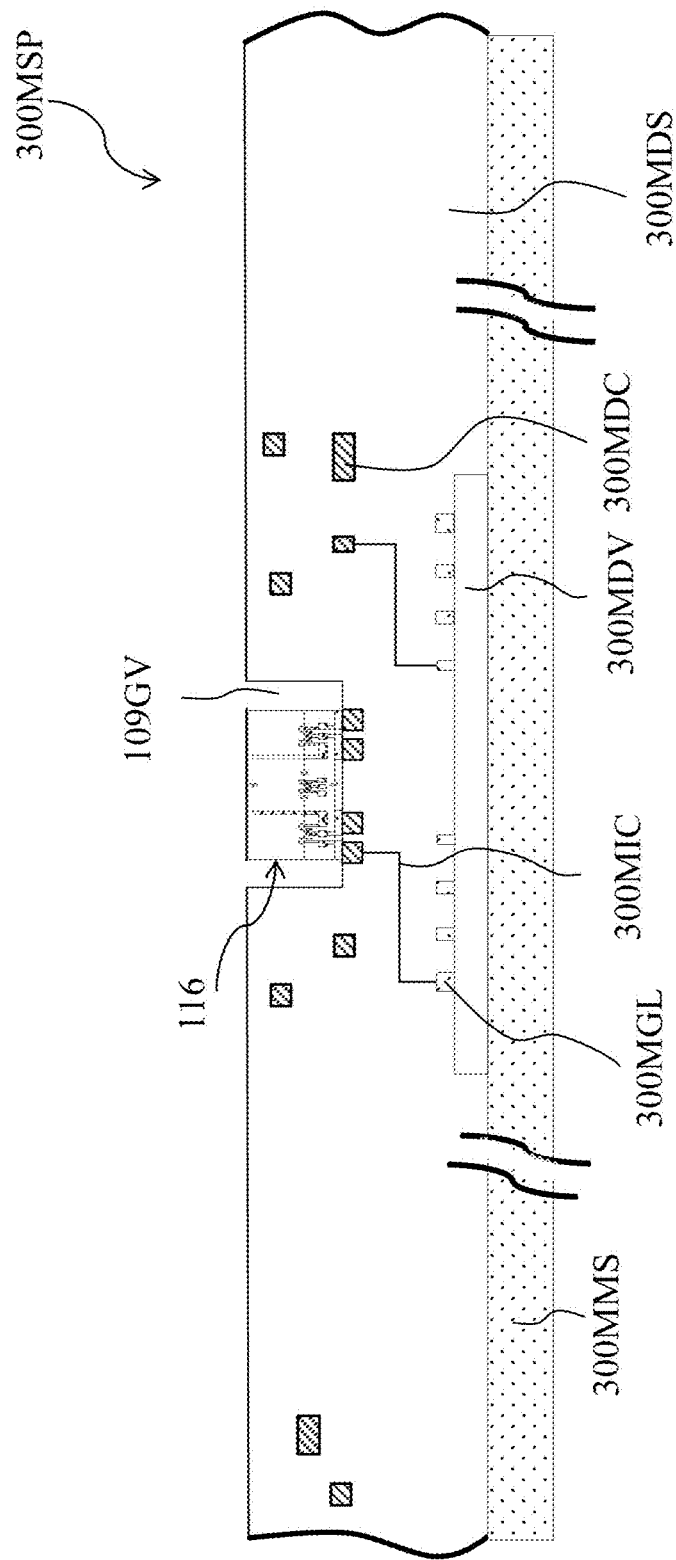

Please refer to FIG. 10A and FIG. 10B, showing cross-section views of the other multimedia device 300MD according to another embodiment of the present invention. The multimedia device 300MD can be divided into two main parts according to the practical application, a multimedia display device 300MDD and a multimedia loudspeaker 300MSP. The multimedia display device 300MDD is similar to the multimedia device 300MD, and includes a plurality of pixel arrays 122PAU and a multimedia substrate 300MDS. Wherein the pixel array 122PAU is separately assembled to the multimedia substrate 300MDS, which includes an active switching element 116, and further includes a display medium module 122U having a plurality of pixel units and display media. The multimedia substrate 300MDS may comprise a concave groove 109GV (or perforation), a conductive pads 300MDC, conductive stud, conductive bump, conductive connection point, conductive wire, the insulating medium, adhesive medium, or one of the abovementioned combinations. With respect to the foregoing elements on the multimedia substrate 300MDS, the electrical connection arrangement between the elements of each pixel array 122PAU should be easier, especially when the pixel array 122PAU includes a plurality of functional elements. The display medium module 122U of the pixel array 122PAU is integrally connected with each pixel array common substrate 122PACS in the pixel array, and arranged the other pixels correspond common substrate (for example, the second substrate 115RS, 102RS) and the display medium 105, 115 to be connected and integrated. In addition, after The display medium module 122U of the plurality of pixel arrays can be integrally formed, and the active switching element 116 assembled in such a manner that the pixel array 122PAU (localized) having mostly flexible display resolution constructed and assembled the localized pixel array 122PAU on a multimedia substrate 300MDS and electrically connected a variety of conductive signal line elements thereon, for completing a multimedia device having any resolution, the display medium module 122U of the array of pixels is integrally formed, the active switching element 116 is assembled, and then the pixel array 122PAU having the display resolution of the elasticity is constructed and then the regionalization The pixel array 122PAU is connected to a multimedia substrate 300MDS and various conductive signal line elements electrically connected to the multimedia substrate 300MDS to complete a multimedia display device 300MDD which can have any resolution. In addition, the pixel array 122PAU is configured in a separate loading and unloading pattern, and not be connected to either of the other pixel arrays 122PAU, so that each pixel array 122PAU can be individually removed from the multimedia device 300MD. Thus, when a pixel array 122PAU is damaged, it can be disassembled and then replaced with a normal pixel array 122PAU without the need to replace the entire set of multimedia devices 300MD.

On the other hand, the multimedia speaker 300MSP is similar to the multimedia device 300MD, and includes an abovementioned multimedia substrate 300MDS, an active switching element 116, and a magnetic substrate 300MMS. The multimedia substrate 300MDS may comprise a concave groove 109GV (or perforation), a magnetic induction 300MGL, a conductive line 300MIC, a conductive pad 300MDC, a conductive post, a conductive bump, a conductive connection, an insulating medium, an adhesive medium or one of the abovementioned combinations. In addition, a plurality of magnetic induction portions 300MGL (conductive circuit patterns) may be formed in the multimedia substrate 300MDS, and at least one cavity portion 300MDV formed on the lower surface of the multimedia substrate 300MDS, and the cavity portion 300MDV is relatively located below the magnetic induction portion 300MGL. Furthermore, the magnetic induction unit 300MGL may be electrically connected to the active switching element 116 (which may contain a plurality of functional elements) for controlling the current magnitude, speed and direction etc. to cause the multimedia substrate 300MDS and the magnetic substrate 300MMS producing an attraction or rejection force from different magnitude and speed, generating vibrations of different sounds from the magnetic substrate 300MMS and/ or the multimedia substrate 300MDS as a lightly thin multimedia speaker device 300MSP.

Figure 11:
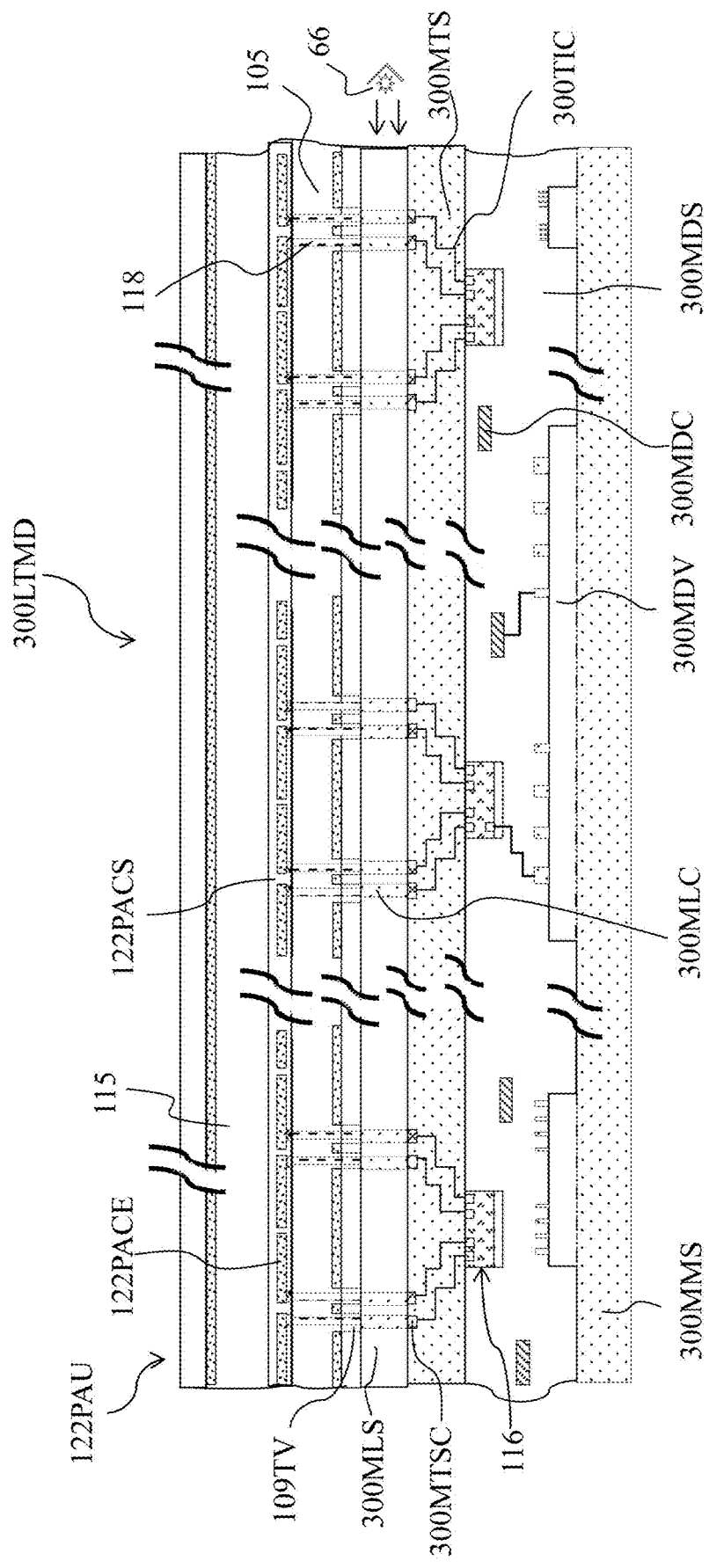
FIG. 11 is a cross-section view of a multimedia device according to another embodiment of the present invention.

Please refer to FIG. 11, showing cross-section views of a further multimedia device 300LTMD according to another embodiment of the present invention. The multimedia device 300LTMD is similar to the multimedia device 300MD described above, and includes a pixel array 122PAU, a multimedia substrate 300MDS, and a magnetic substrate 300MMS, further comprises a multimedia signal circuit substrate 300MTS having a signal connection function and a multimedia light source substrate 300MLS. The multimedia signal line substrate 300MTS includes a plurality of conductive lines 300TIC, a line conductive pad 300MTSC, a conductive pillar, a conductive bump, a conductive connection point, an insulating medium, an adhesive medium, or a combination thereof. The multimedia light source substrate 300MLS comprises an electrical conductor 300MLC used as an electrical connection function, and further comprise other optically functional structures (e.g., polarized light, refraction, reflection, diffuse, light guide, diffusion, brightening, or a combination thereof). In addition, the upper and lower surfaces of the substrate or therein may be provided directly as light source control device such as light emitting, photosensitive, conductive lines, and thermal conduction and so on.

Specifically, if all the display media 105, 115, etc. of the pixel array 122PAU are non-self-luminous medium materials, the multimedia device 300LTMD may further include a light source module 66, which may be located on either side (e.g., rear side, upper and lower side, front side, left and right side) of the display medium module 122U of the pixel array 122PAU. In addition, a function such as one of the conductive elements 300MLC, the light emitting, the photosensitive, the conductive lines, the thermal conduction, or the like, or a combination thereof, may be provided by combining the multimedia light source substrate 300MLS to provide an electrical connection function and/or light to the medium module 122U. In addition, the multimedia light source substrate 300MLS combined with a function such as a the conductive elements 300MLC, light emitting, photosensitive, conductive lines, and thermal conduction, or a combination thereof, to provide an electrical connection function and/or light to the medium module 122U. If all the display media 105, 115 of the pixel array 122PAU are self-luminous medium materials or use the ambient light as the light source, the light source module 66 may be selected to be omitted or turned off (i.e., the light source module 66 is off); The light source module 66 is operable to provide additional light when the light or ambient light provided by the display medias 105 and 115 of the self-luminous medium material is insufficient. On the other hand, each of the active switching elements 116 mounted in the concave groove of another multimedia substrate 300MDS by the above-described various elements of the multimedia signal line substrate 300MTS, a perforation 109TV embedded conductor 118 and further be included the first substrate 101PS and/or the second substrate 102RS of the display medium module 122U therein, and a conductor 300MLC provided on the multimedia light source substrate 300MLS are electrically connected to the pixel array common electrode 122PACE (or the aforementioned first electrode or the second electrode) to control the state of the display medium of the each medium module 122U.

On the other hand, all the pixel units, the pixel array, and the multimedia device described above may include a function element 151 having a wireless communication function that can wirelessly receive the control signal and data signal of the control module 33 of the multimedia device 300MD, and then transmits the signals to the active switching element 116. In other words, the control module 33 may not be electrically connected to the active switching element 116 through a solid conductor (e.g., the control signal line 1G and the data signal line 1D shown in FIG. 2B). The control module 33 may control the active switching element 116 wirelessly, thereby controlling the state of the display media 105 and 115. In addition, a functional element 151 having a wireless communication function can be electrically connected to the plurality of active switching elements 116 of the pixel unit, the pixel array, and the multimedia device abovementioned at the same time, so that the overall number of the functional elements 151 may be smaller than number of active switch elements 116; the overall number of active switching elements 116 may be smaller than the total number of pixel units, pixel arrays, and multimedia devices.

The foregoing functional element 151 with the function of wireless communication may be of (but not limited to) the following types: radio frequency (RF) wireless transmission, Zigbee wireless transmission, blue-tooth communication, infrared ray, wireless fidelity (Wi-Fi) wireless transmission, personal area networks (PAN), local area networks (LAN), near field communication (NFC), radio frequency identification (RFID), global system for mobile communication (GSM) and worldwide interoperability for microwave access (WiMAX), long-term evolution (LTE), 5th generations wireless communications, various types of wireless communication methods and one of the combinations thereof.

The combinations of the display media module shapes of all the different constructed pixel units, pixel arrays, and multimedia devices may be the following (not limited to): square, rectangular, fan, triangular, trapezoidal, circular, rhombus, rectangle, regular polygon, a polygon, irregular shape or a combination thereof. And the combination of the shapes of the first electrodes 101PE, the second electrodes 102RE, the pixel electrodes, and/or the pixel unit common electrode in the above-described display medium modules may be the following (not limited to): square, rectangular, fan, triangle, trapezoid, circle, rhombus, rectangle, regular polygon, polygon, irregular shape or a combination thereof. Alternatively, a geometric pattern (e.g., square, rectangle, fan, triangle, trapezoid, circle, rhombus, rectangle, regular polygon, polygon, irregular shape, etc.) may be provided on the pixel electrode to enhance the display performance of the display medium.

Described below are a manufacturing method of a pixel unit, a pixel array, and a multimedia device according to the present invention and an application as a multimedia device.

Figure 12:
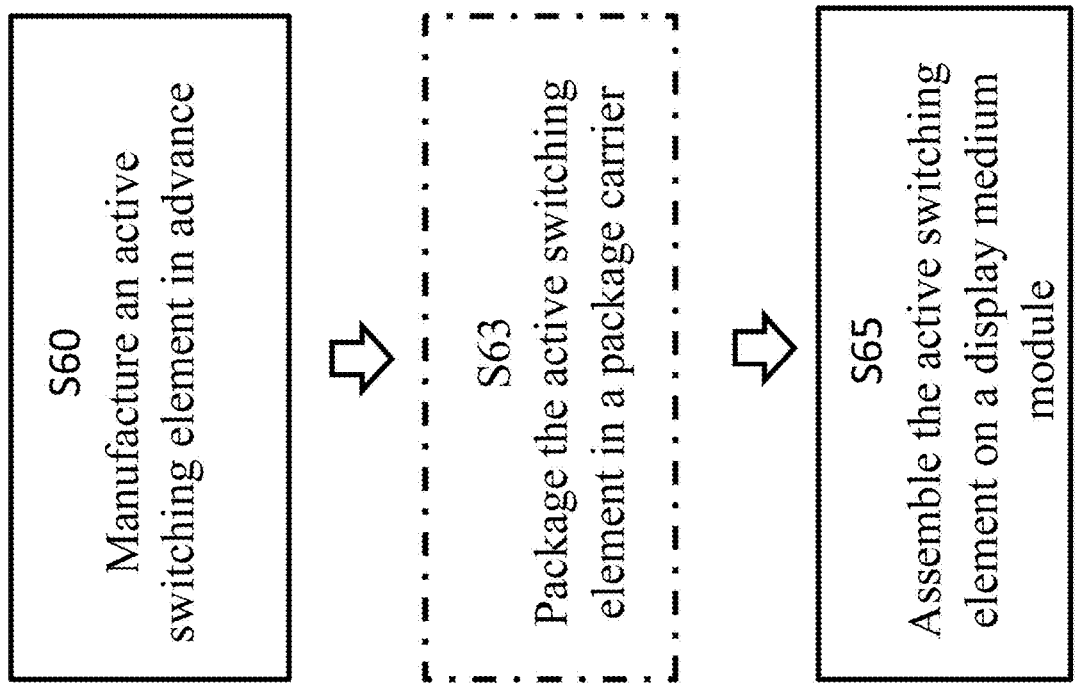
FIG. 12 is a flow diagram showing a manufacturing method of a pixel unit according to another embodiment of the present invention.

Please refer to FIG. 12, showing a flow diagram of a manufacturing method of a pixel unit according to another embodiment of the present invention the manufacturing method may produce one or a plurality of identical or similar pixel units 1PU, 1FKPU, 1FPU, 1T12PU and 2T12PU of the above embodiments. Therefore, the technical contents of the manufacturing method and the technical content of the pixel units 1PU, 1FKPU, 1FPU, 1T12PU and 2T12PU may be cross-referenced.

As step S60 shows, firstly manufacture an active switching element; that is, in contrast with a display medium module of a pixel unit, the active switching element is independently manufactured, rather than being directly manufactured on the display medium module. The functional elements are also manufactured in advance and may be manufactured on the same active switching element substrate (or on different active switching element substrate from), and the functional element and the active switching element may be on the same active switching element substrate portion (or a different active switching element substrate portion).

Next, as Step S65 shows, assemble the pre-manufactured active switching element to the display medium module. At this moment, the display medium module may be in a manufacturing process, for example, only after the active switching element is disposed on the second substrate of the display medium module, the display medium, the pixel unit common electrode 112PCE, the pixel corresponding common electrode 112RCE, and the first substrate sequentially disposed on the second substrate. In addition, in Step S65, functional elements may also be simultaneously assembled to the display medium module.

Further, before performing Step S65, the pre-manufactured active switching element may be optionally packaged in a package carrier (e.g. in Step S63); the functional elements may also be simultaneously packaged in the package carrier. Therefore, if there is no need of a package carrier, S63 may be omitted.

Figure 13:
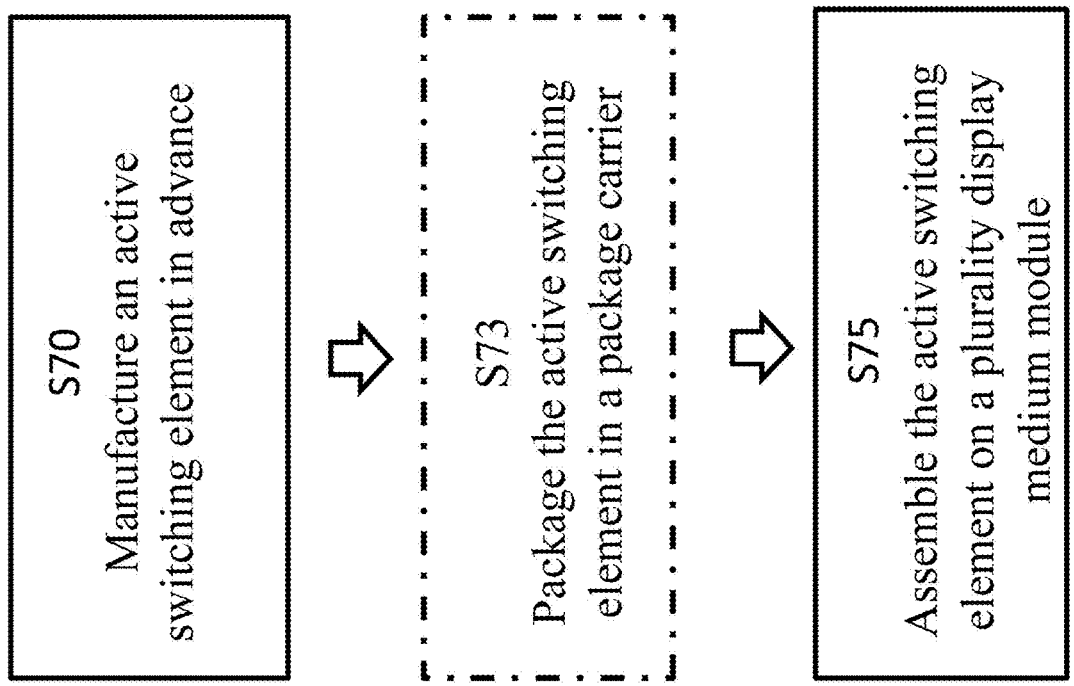
FIG. 13 is a flow diagram showing a manufacturing method of a pixel array according to another embodiment of the present invention.

Please refer to FIG. 13, showing a flow diagram of a manufacturing method of a pixel unit according to another embodiment of the present invention. The manufacturing method may produce one or a plurality of identical or similar pixel arrays 122PAU and 222PAU of the above embodiments. Therefore, the technical contents of the manufacturing method and the technical content of the pixel arrays 122PAU and 222PAU may be cross-referenced.

As step S70 shows, firstly manufacture an active switching element; that is, in contrast with a display medium module of a pixel array, the active switching element is independently manufactured, rather than being directly manufactured on the display medium module. The functional elements are also manufactured in advance and may be manufactured on the same active switching element substrate (or on different active switching element substrate from), and the functional element and the active switching element may be on the same active switching element substrate portion (or a different active switching element substrate portion).

Next, as Step S75 shows, assemble the pre-manufactured active switching element to the display medium module. At this moment, the display medium module may be in a manufacturing process, for example, only after the active switching element is disposed on the second substrate of the display medium module, the display medium, the pixel unit common electrode 112PCE, the pixel corresponding common electrode 112RCE, and the first substrate sequentially disposed on the second substrate. In addition, in Step S75, functional elements may also be simultaneously assembled to the display medium module.

Further, before performing Step S75, the pre-manufactured active switching element may be optionally packaged in a package carrier (e.g. in Step S73); the functional elements may also be simultaneously packaged in the package carrier. Therefore, if there is no need of a package carrier, S73 may be omitted.

Figure 14:
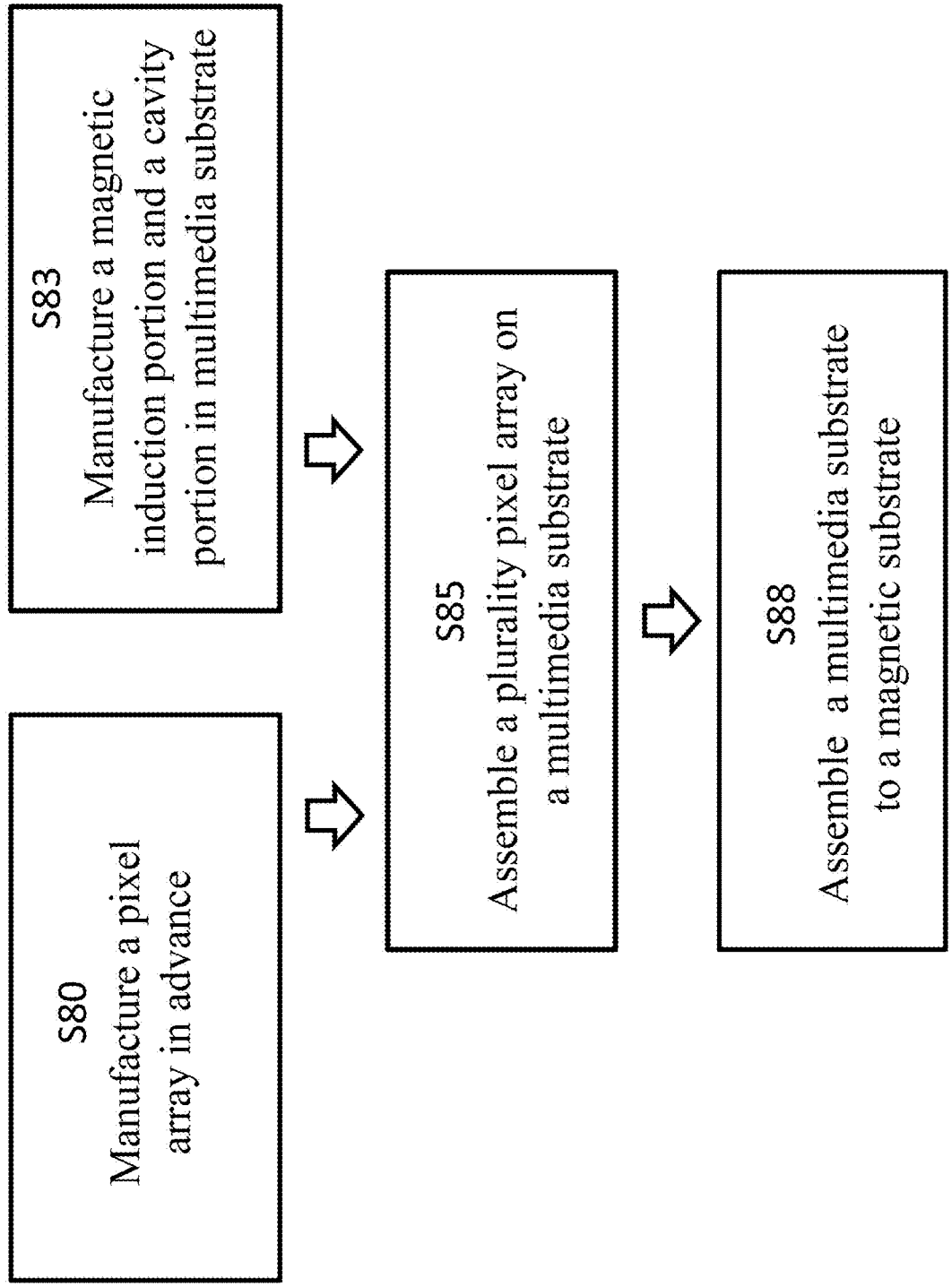
FIG. 14 is a flow diagram showing a manufacturing method of a multimedia device according to another embodiment of the present invention.

Please refer to FIG. 14, showing a flow diagram of a manufacturing method of a multimedia device according to another embodiment of the present invention. The manufacturing method may produce one or a plurality of identical or similar multimedia device 300MD, the multimedia display device 300MDD and the multimedia speaker device 300MSP of the above embodiments. Therefore, the technical contents of the manufacturing method and the technical content of the multimedia device 300MD, the multimedia display device 300MDD and the multimedia speaker device 300MSP may be cross-referenced.

As step S80 shows, firstly manufacture a pixel array 122PAU; in the same manner, as step S83, a multimedia substrate including a magnetic induction unit 300MGL and a cavity 300MDV is constructed, and the pixel array is independently manufactured, rather than directly on the multimedia substrate made out. Then, as in step S85, Then, as in step S85, the finished cell array is arranged in an independent loading and unloading pattern (i.e., none of the elements of the pixel array 122PAU is integrally connected) or is first constructed as a pixel array having a localized display resolution, then the pixel array 122PAU is assembled in the multimedia substrate 300MDS. In addition, in step 88, the multimedia substrate 300MDS is assembled and bonded together with a magnetic substrate 300MMS so that the magnetic induction unit 300MGL can be electrically connected to the active switching element 116 of the pixel array for controlling the magnetic induction unit 300MGL current magnitude, speed and direction to cause the multimedia substrate 300MDS and the magnetic substrate 300MMS producing an attraction or rejection force from different magnitude and speed, to generate vibrations of different sounds from the magnetic substrate 300MMS and/or the multimedia substrate 300MDS, and to match an image shown on the pixel array 122PAU can be used as a multimedia device having a loudness function and a lightness. In addition to multimedia devices can be applied to computers, mobile phones and other electronic products, can also be used in vehicles, wearing objects, buildings, advertising, advertising billboards and other items needed any additional display and voice features.

Figure 15:
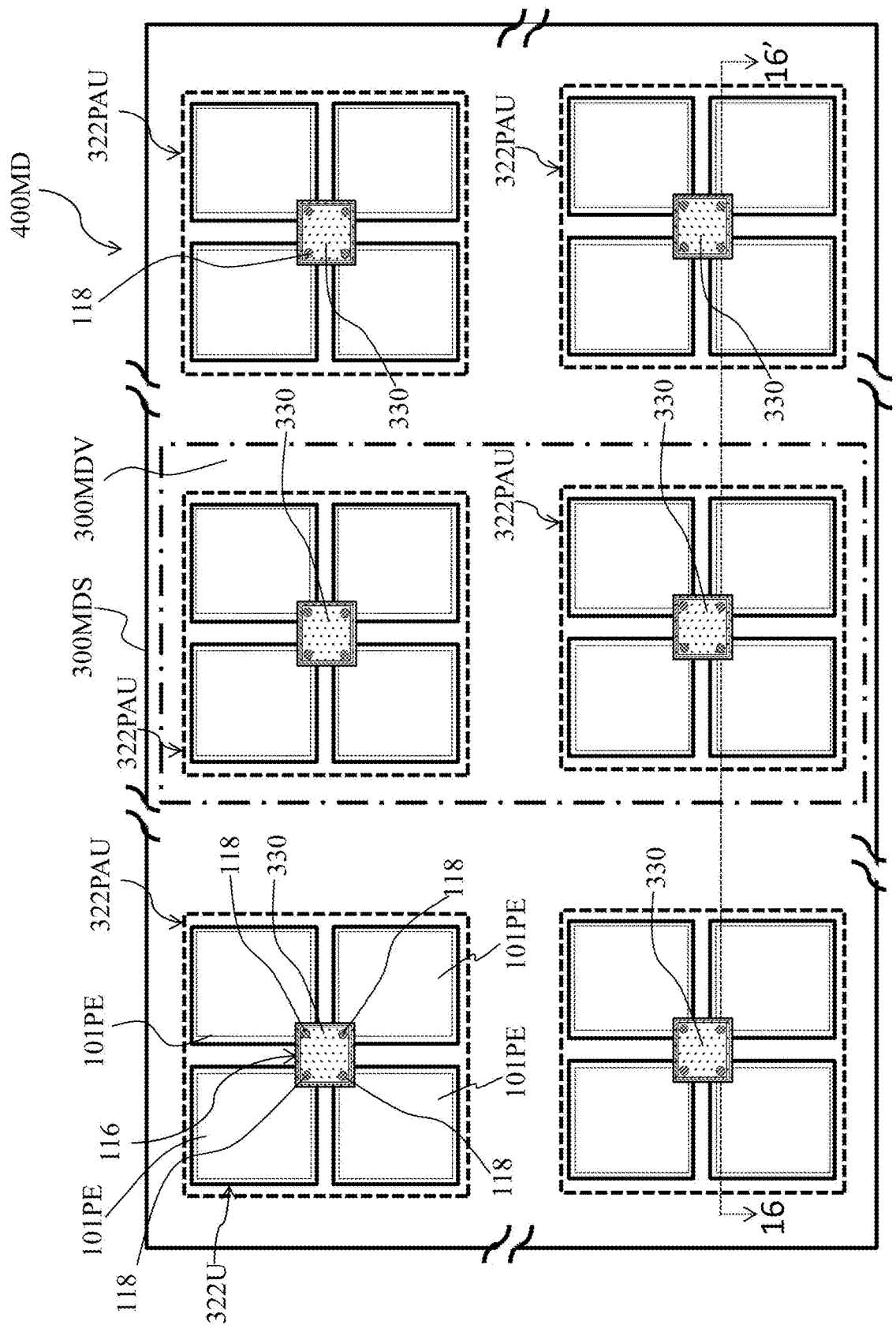
FIG. 15 shows a top view of a display apparatus according to another embodiment of the present invention.
Figure 16:
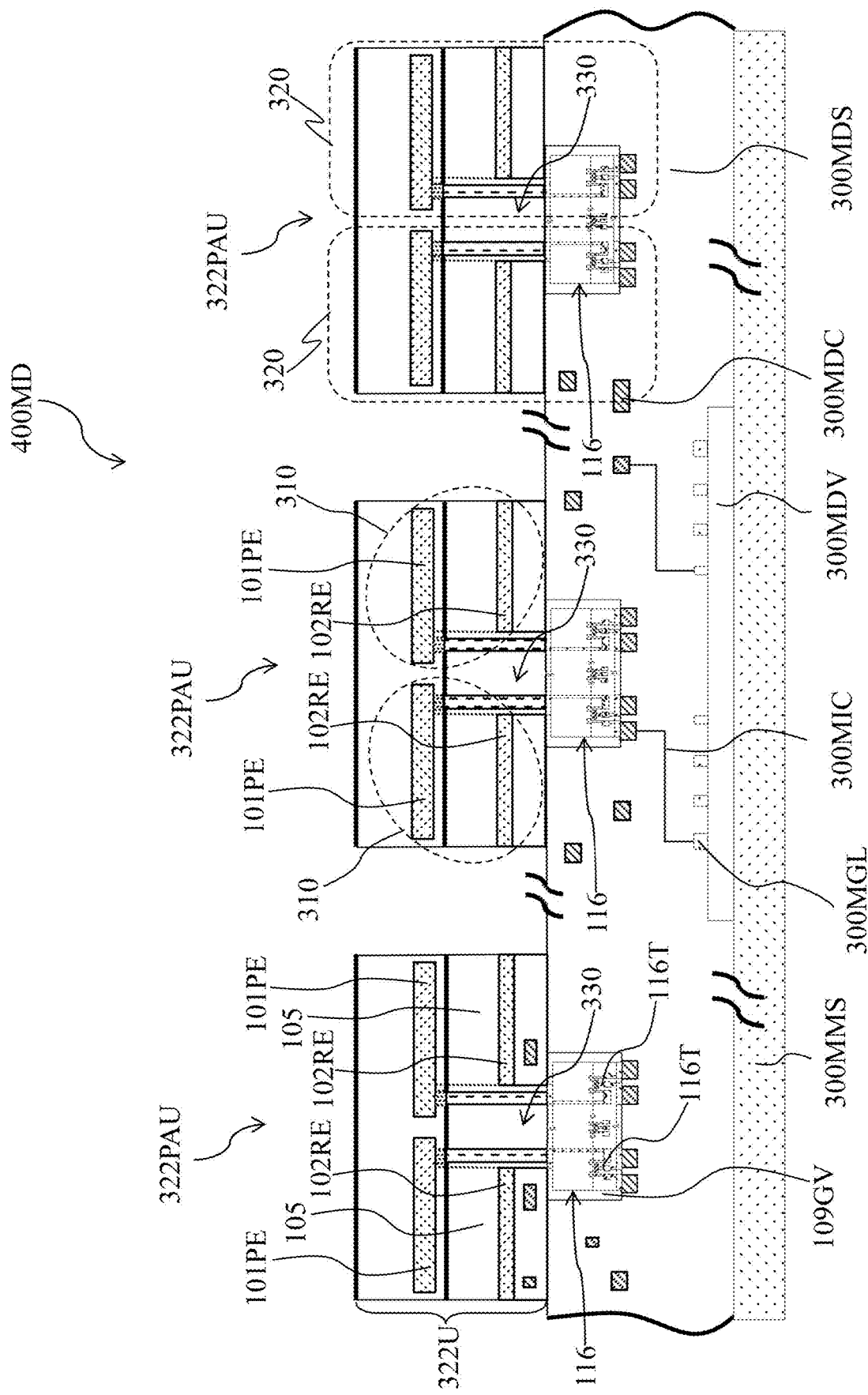
FIG. 16 is a cross-section view of the display apparatus along the line 16-16' in FIG. 15.
Figure 17:
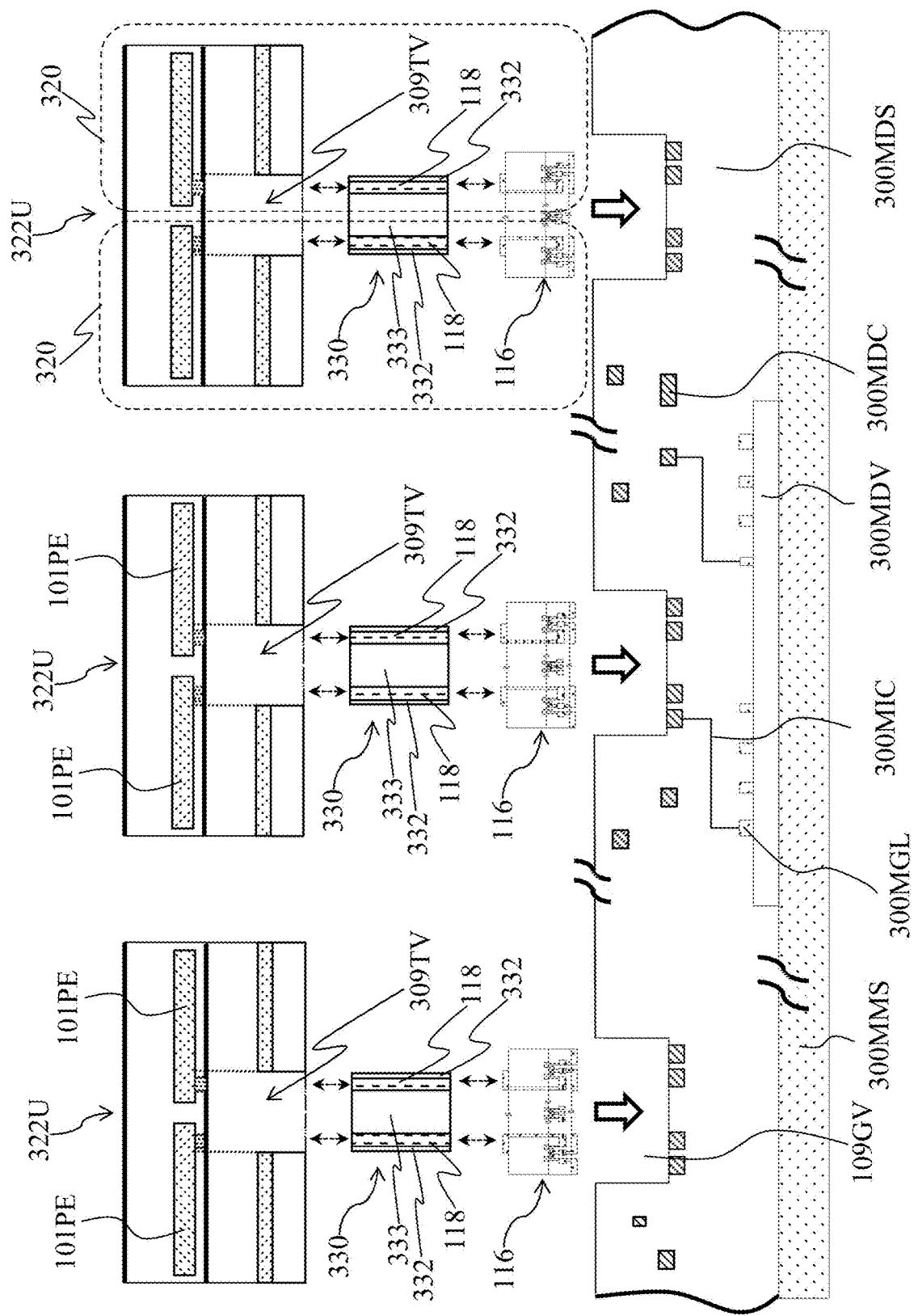
FIG. 17 is a schematic view showing the assembly of the display apparatus in FIG. 16.

Please refer to FIGS. 15 to 17. FIG. 15 shows a top view of a display apparatus 400MD according to another embodiment of the present invention. FIG. 16 is a cross-section view of the display apparatus 400MD along the line 16-16' in FIG. 15. FIG. 17 is a schematic view showing the assembly of the display apparatus 400MD. The display apparatus 400MD comprises the abovementioned multimedia substrate 300MDS and the magnetic substrate 300MMS. The pixel arrays 122PAU of the multimedia device 300MD are replaced by a plurality of pixel arrays 322PAU of the display apparatus 400MD. Each of the pixel arrays 322PAU comprises a display medium module 322U, an active switching element 116, and a connecting module 330. The display medium module 322U comprises at least two pairs 310 of electrodes and a display medium 105. Each pair 310 of electrodes comprises a first electrode 101PE and a second electrode 102RE. One of the first electrodes 101PE and the second electrodes 102RE may also be connected and integrated to serve as a pixel corresponding electrode. In the embodiment, the display medium module 322U has four pairs 310 of electrodes, but the present invention is not limited thereto. The display medium 105 is disposed between the first electrodes 101PE and the second electrodes 102RE of the display medium module 322U. The active switching element 116 is electrically connected to first electrodes 101PE for allowing the first electrodes 101PE and the second electrodes 102RE to change a state of the display medium 105. The connecting module 330 is an interposer integrated with the display medium module 322U and disposed in a perforation 309TV of the pixel array 322PAU and/or inside of the groove 109GV of the multimedia substrate 300MDS, the groove of the pixel array 322PAU or the display medium module 322U. The connecting module 330 comprises a plurality of conductors 118 for electrically connecting the active switching element 116 of the pixel array 322PAU to first electrodes 101PE of the display medium module 322U. The perforation 309TV may be formed in the pixel array 322PAU by using a laser beam, etching or punching the display medium module 322U. The connecting module 330 may further comprise an electromagnetic interference (EMI) shield 332 and/or insulating material 333. The EMI shield 332 is used to prevent EMI or radio frequency interference (RFI) from impacting signals transmitted by the conductors 118, and the insulating material 333 is used to electrically isolate the conductors 118 from each other.

In the embodiment, each pixel array 322PAU comprises four pixel units 320. Each of the pixel units 320 comprises one pair 310 of electrodes 101PE and 102RE, a conductor 118 of the connecting module 330, and a transistor portion 116T of the active switching element 116. Since four pixel units 320 share the same connecting module 330, time for forming all of the perforations 309TV of the display apparatus 400MD is about one quarter of time for forming all of the perforations 109TV of the multimedia device 300MD shown in FIG. 9B if the number of the pixel arrays 322PAU of the display apparatus 400MD is the same as the number of the pixel arrays 122PAU of the multimedia device 300MD.

Figure 18:
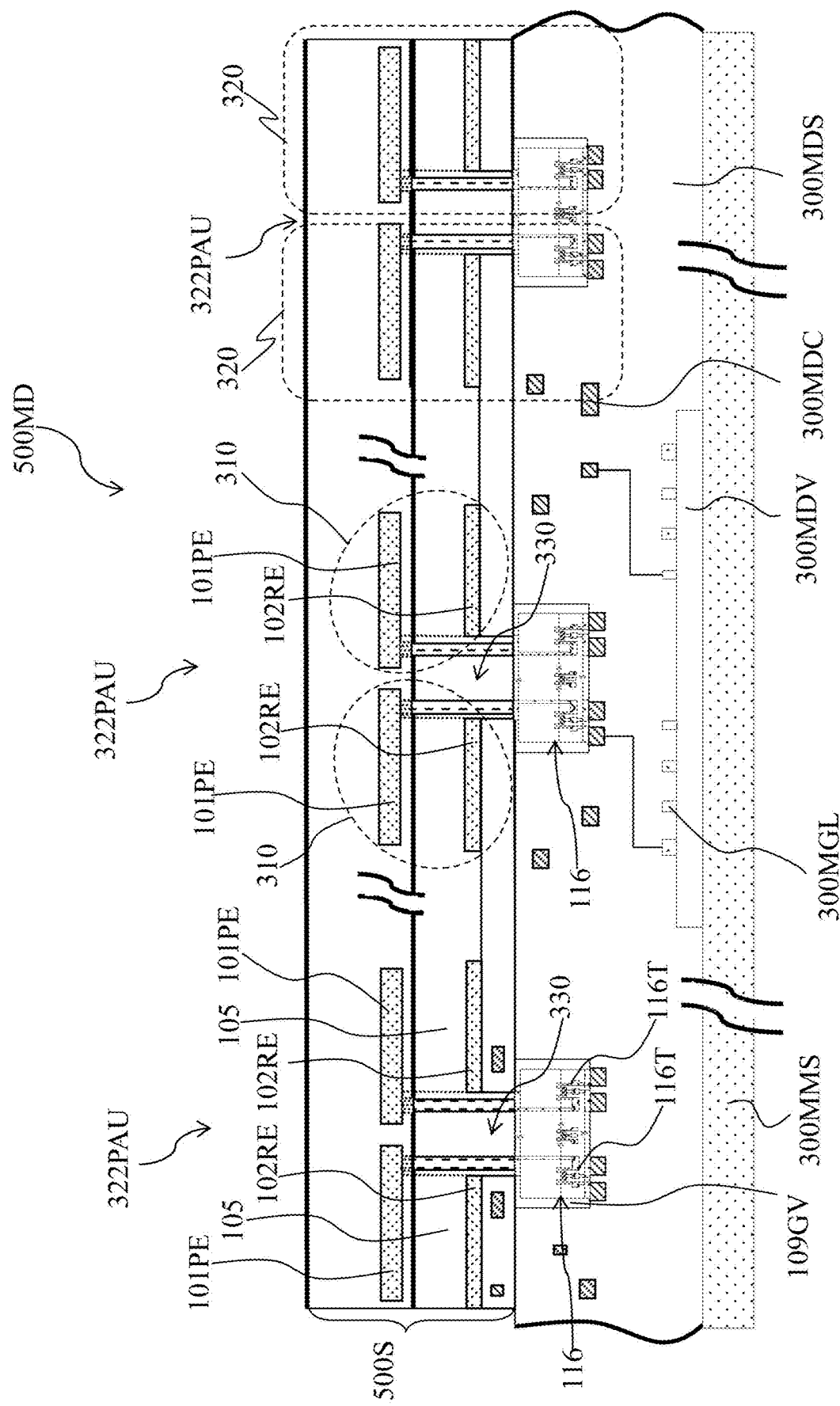
FIG. 18 is a cross-section view of a display apparatus according to another embodiment of the present invention.
Figure 19:
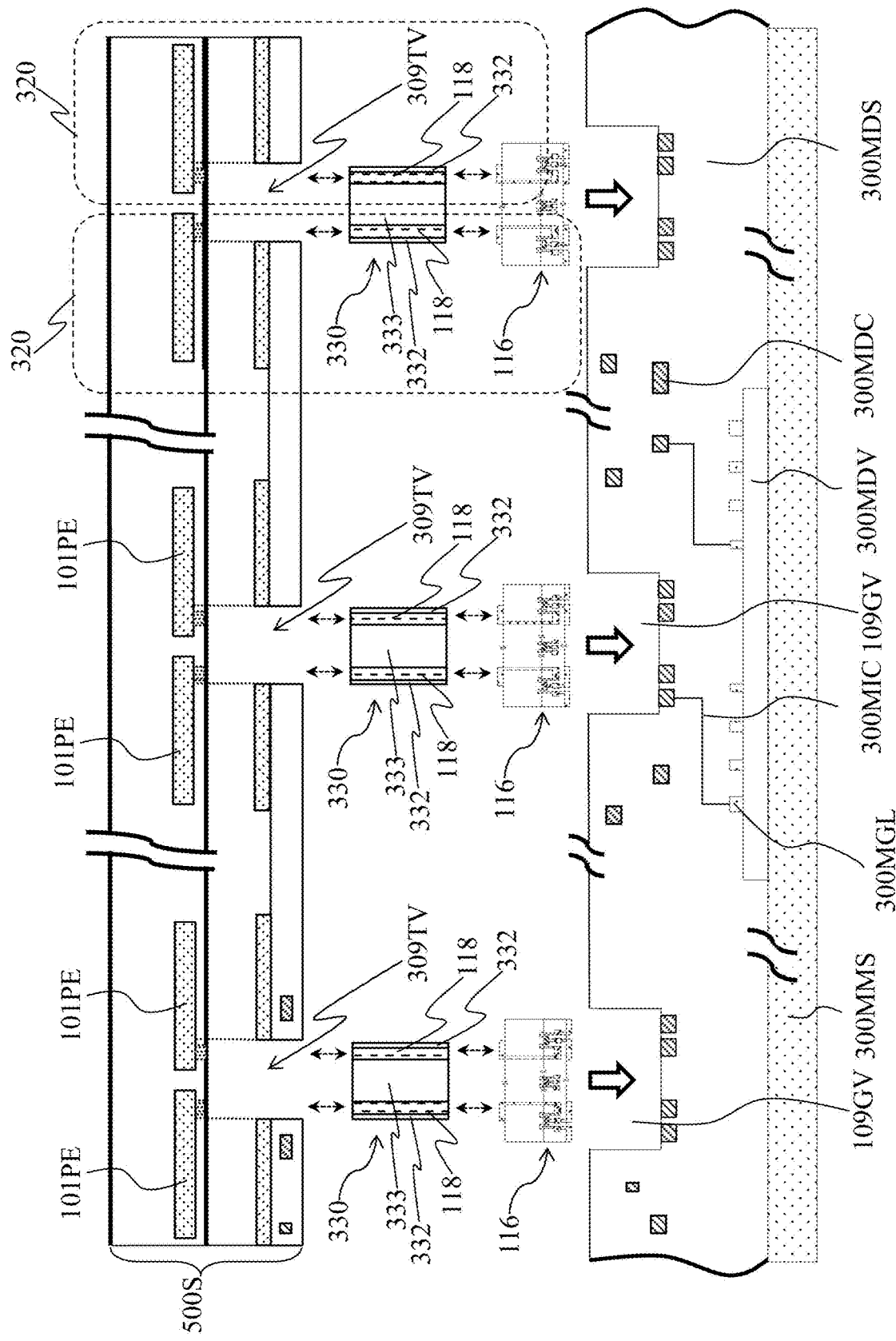
FIG. 19 is a schematic view showing the assembly of the display apparatus in FIG. 18.

Please refer to FIGS. 18 and 19. FIG. 18 is a cross-section view of a display apparatus 500MD according to another embodiment of the present invention. FIG. 19 is a schematic view showing the assembly of the display apparatus 500MD. The display apparatus 500MD is similar to the display apparatus 400MD shown in FIGS. 16 and 17. A difference between the display apparatuses 400MD and 500MD is that the pixel arrays 322PAU of the display apparatus 500MD are formed in an array substrate 500S, and the pixel arrays 322PAU of the display apparatus 400MD are separated from each other.

Figure 20:
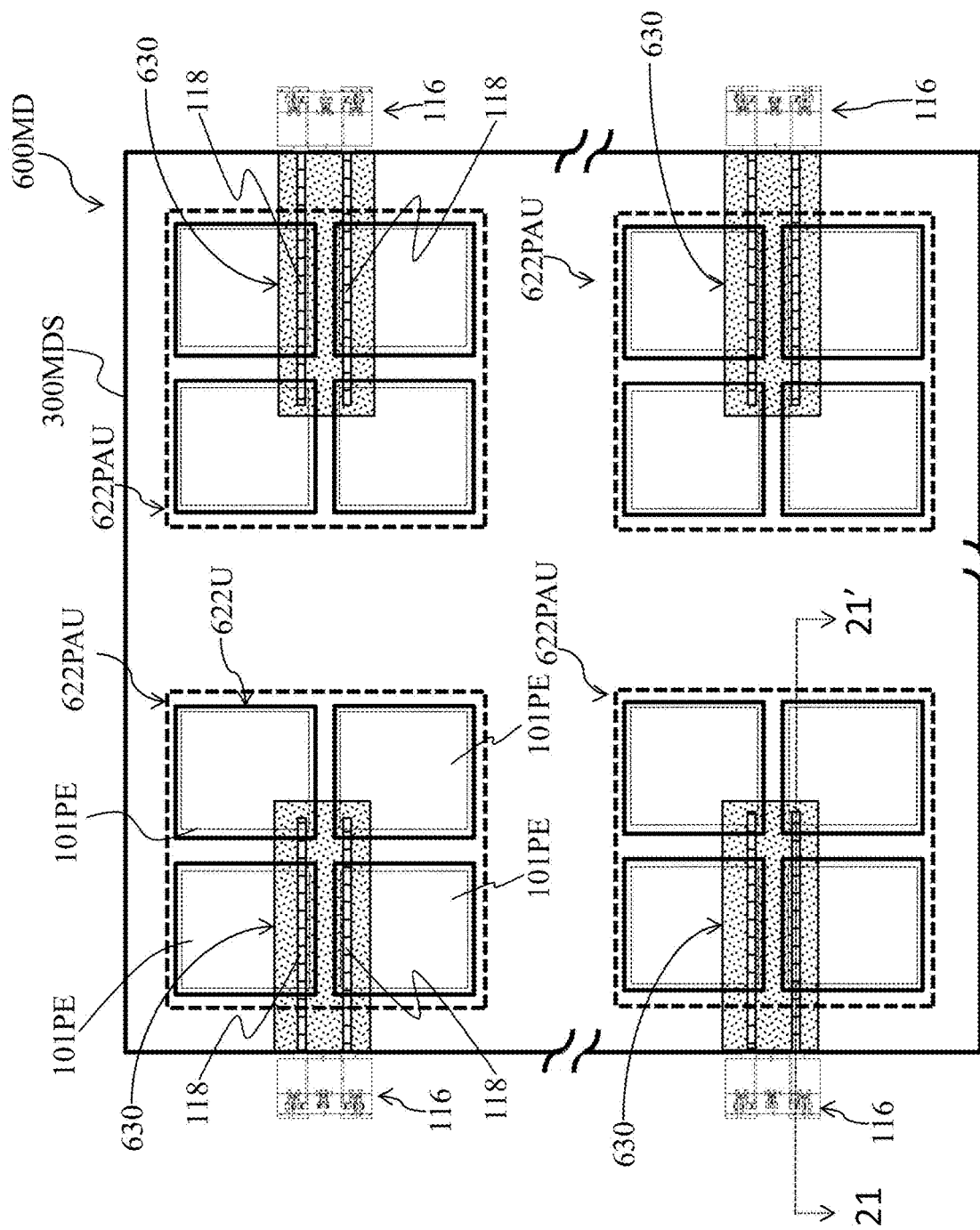
FIG. 20 shows a top view of a display apparatus according to another embodiment of the present invention.
Figure 21:
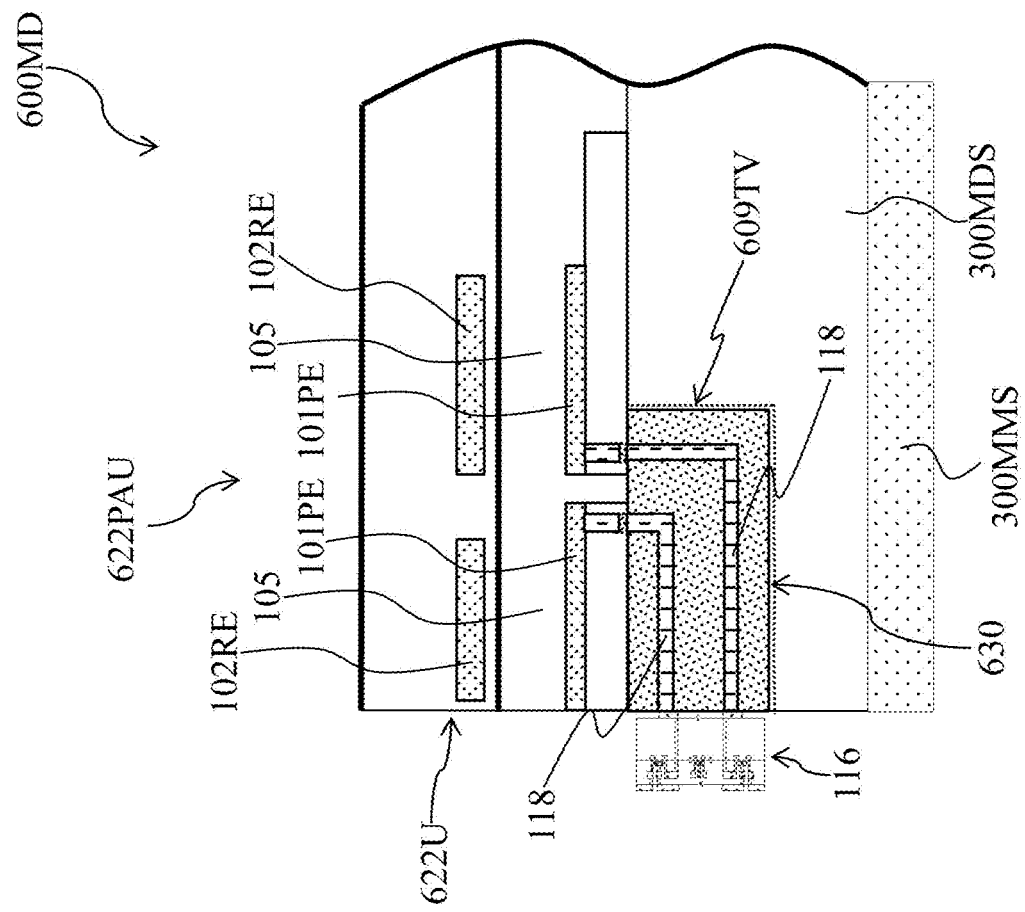
FIG. 21 is a cross-section view of the display apparatus along the line 21-21' in FIG. 20.
Figure 22:
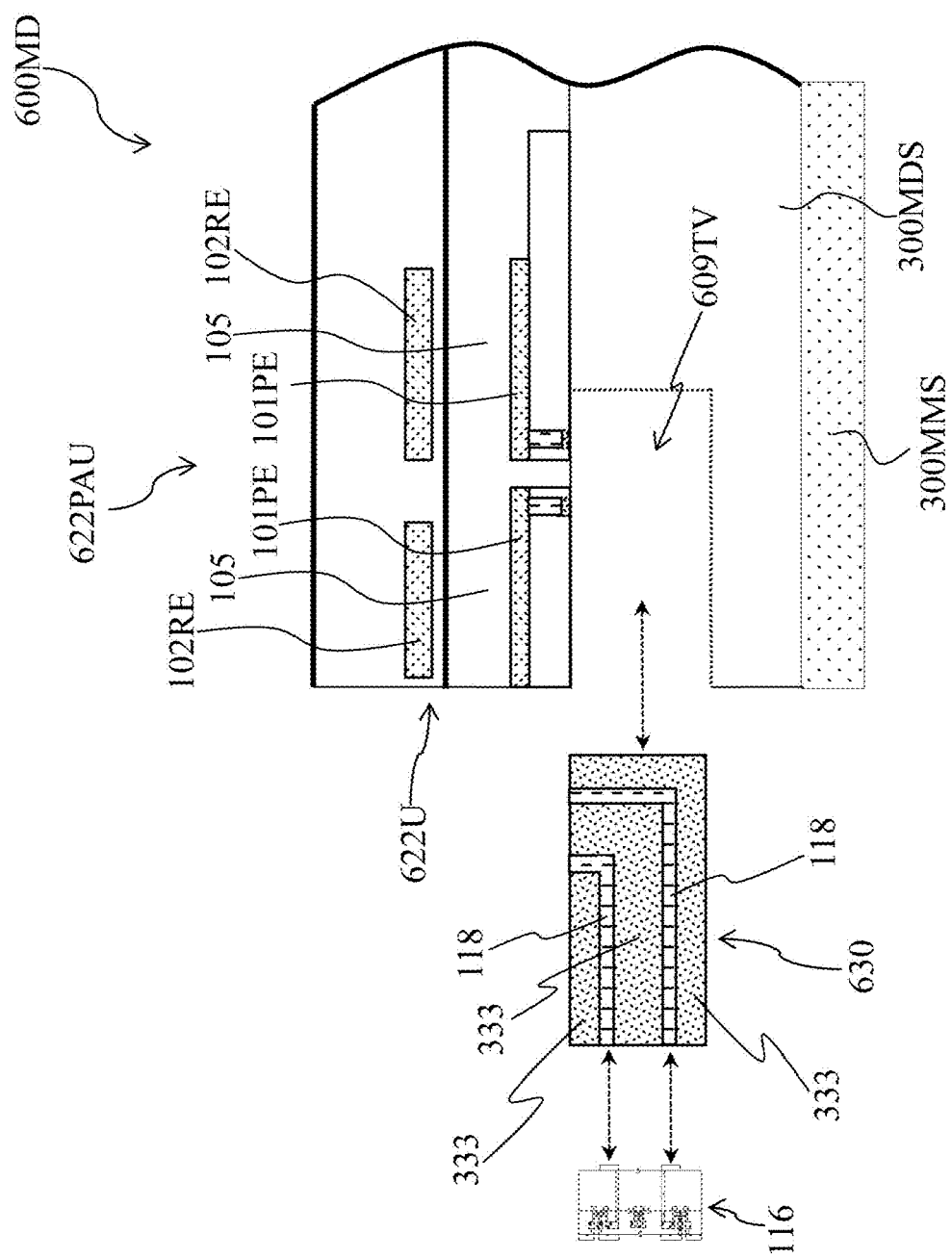
FIG. 22 is a schematic view showing the assembly of the display apparatus in FIG. 20.

Please refer to FIGS. 20 to 22. FIG. 20 shows a top view of a display apparatus 600MD according to another embodiment of the present invention. FIG. 21 is a cross-section view of the display apparatus 600MD along the line 21-21' in FIG. 20. FIG. 22 is a schematic view showing the assembly of the display apparatus 600MD in FIG. 20. The display apparatus 600MD comprises a plurality of pixel arrays 622PAU. Each of the pixel arrays 622PAU comprises a display medium module 622U, an active switching element 116, and a connecting module 630. The display medium module 622U comprises at least two pairs of electrodes and a display medium 105. Each pair of electrodes comprises a first electrode 101PE and a second electrode 102RE. In the embodiment, the display medium module 622U also has four pairs of electrodes, but the present invention is not limited thereto. The display medium 105 is disposed between the first electrodes 101PE and the second electrodes 102RE of the display medium module 622U. The active switching elements 116 are disposed on the edge of the display apparatus 600MD. Each active switching element 116 is electrically connected to first electrodes 101PE for allowing the first electrodes 101PE and the second electrodes 102RE to change a state of the display medium 105. A plurality of perforations 609TV are formed in the display apparatus 600MD. Each connecting module 630 is an interposer integrated with the display medium module 622U and disposed in one of the perforations 609TV. Each connecting module comprises a plurality of conductors 118 for electrically connecting the active switching element 116 of the pixel array 622PAU to first electrodes 101PE of the display medium module 622U. The connecting module 630 may further comprise insulating material 333, which is used to electrically isolate the conductors 118 from each other.

Figure 23:
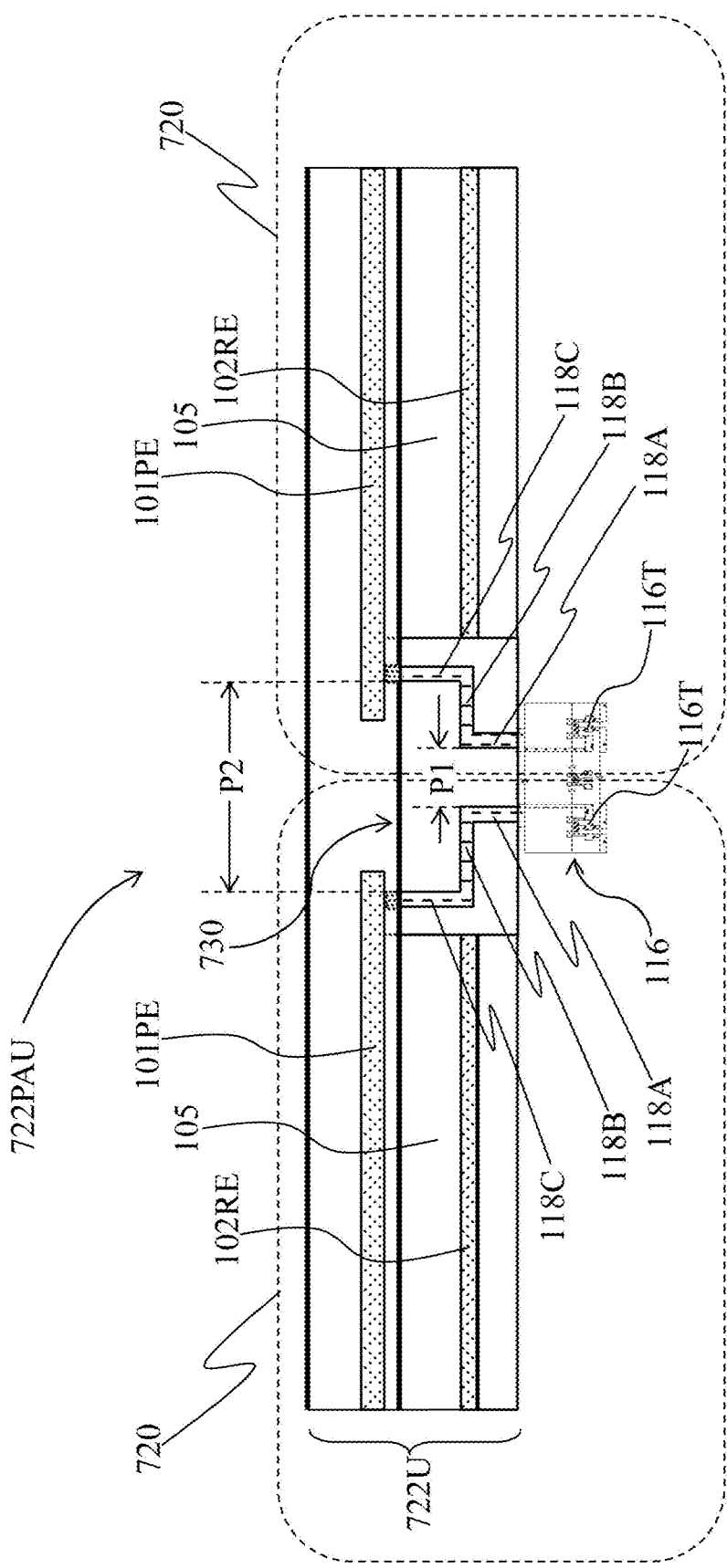
FIG. 23 is a cross-section view of a pixel array of a display apparatus according to another embodiment of the present invention.
Figure 24:
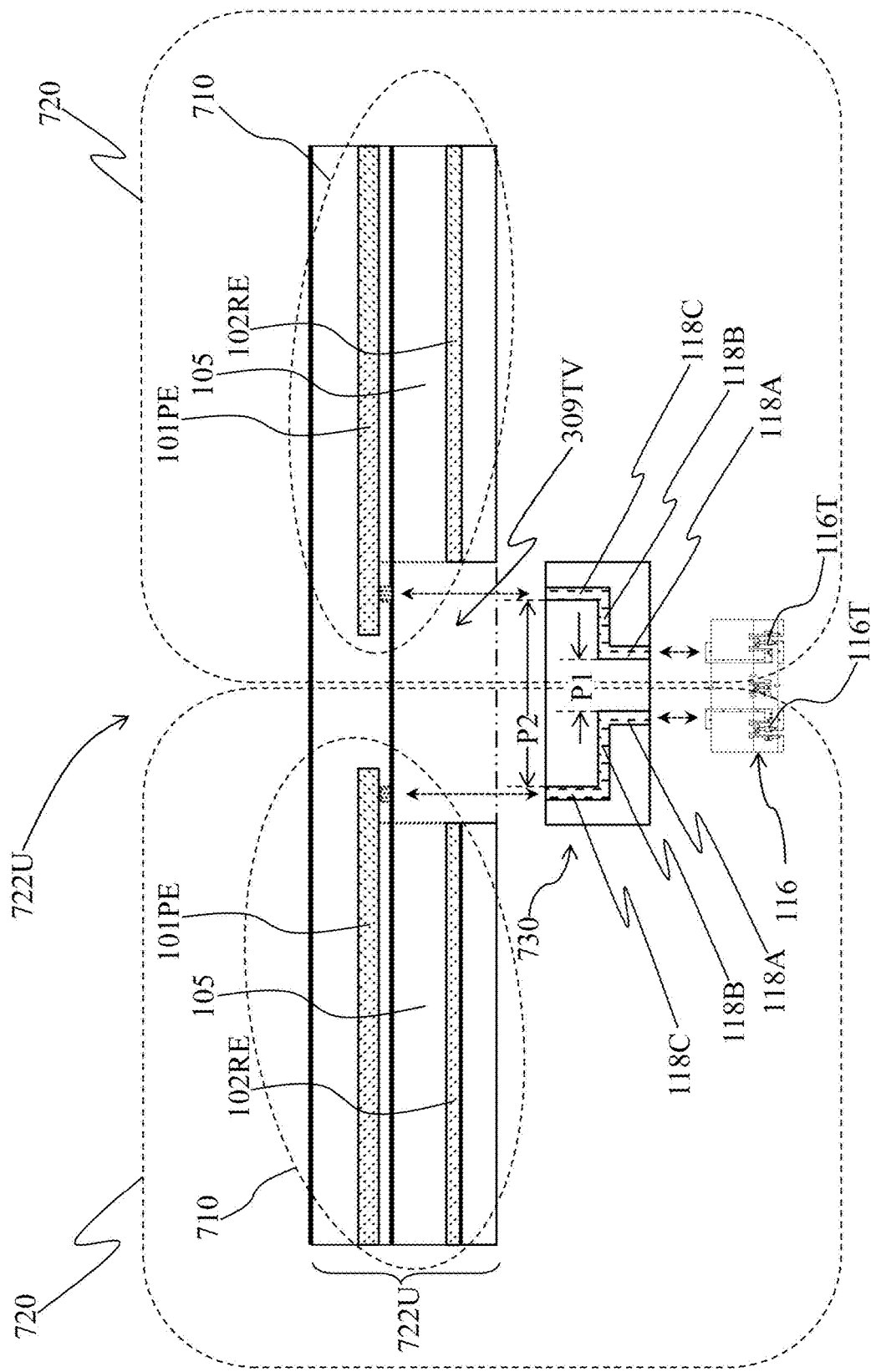
FIG. 24 is a schematic view showing the assembly of the pixel array in FIG. 23.

In another embodiment, the connecting module may be a pitch connector. Please refer to FIGS. 23 and 24. FIG. 23 is a cross-section view of a pixel array 722PAU of a display apparatus according to another embodiment of the present invention. FIG. 24 is a schematic view showing the assembly of the pixel array 722PAU in FIG. 23. The pixel array 722PAU comprises a display medium module 722U, an active switching element 116, and a connecting module 730. The display medium module 722U comprises at least two pairs 710 of electrodes and a display medium 105. Each pair 710 of electrodes comprises a first electrode 101PE and a second electrode 102RE. In the embodiment, the display medium module 722U has four pairs 710 of electrodes, but the present invention is not limited thereto. The display medium 105 is disposed between the first electrodes 101PE and the second electrodes 102RE of the display medium module 722U. The active switching element 116 is electrically connected to first electrodes 101PE for allowing the first electrodes 101PE and the second electrodes 102RE to change a state of the display medium 105. The connecting module 730 is a pitch connector integrated with the display medium module 722U and disposed in a perforation 309TV of the pixel array 722PAU. The connecting module 730 comprises a plurality of conductors 118A, 118B and 118C for electrically connecting the active switching element 116 of the pixel array 722PAU to first electrodes 101PE of the display medium module 722U. The perforation 309TV may be formed in the pixel array 722PAU by using a laser beam, etching or punching the display medium module 722U. The pitch P1 between two conductors 118A contacting with the active switching element is less than the pitch P2 between two conductors 118C contacting with the first electrodes 101PE.

In the embodiment, each pixel array 722PAU comprises four pixel units 720. Each of the pixel units 720 comprises one pair 710 of electrodes 101PE and 102RE, three conductors 118A, 118B and 118C of the connecting module 730, and a transistor portion 116T of the active switching element 116.

Figure 25:
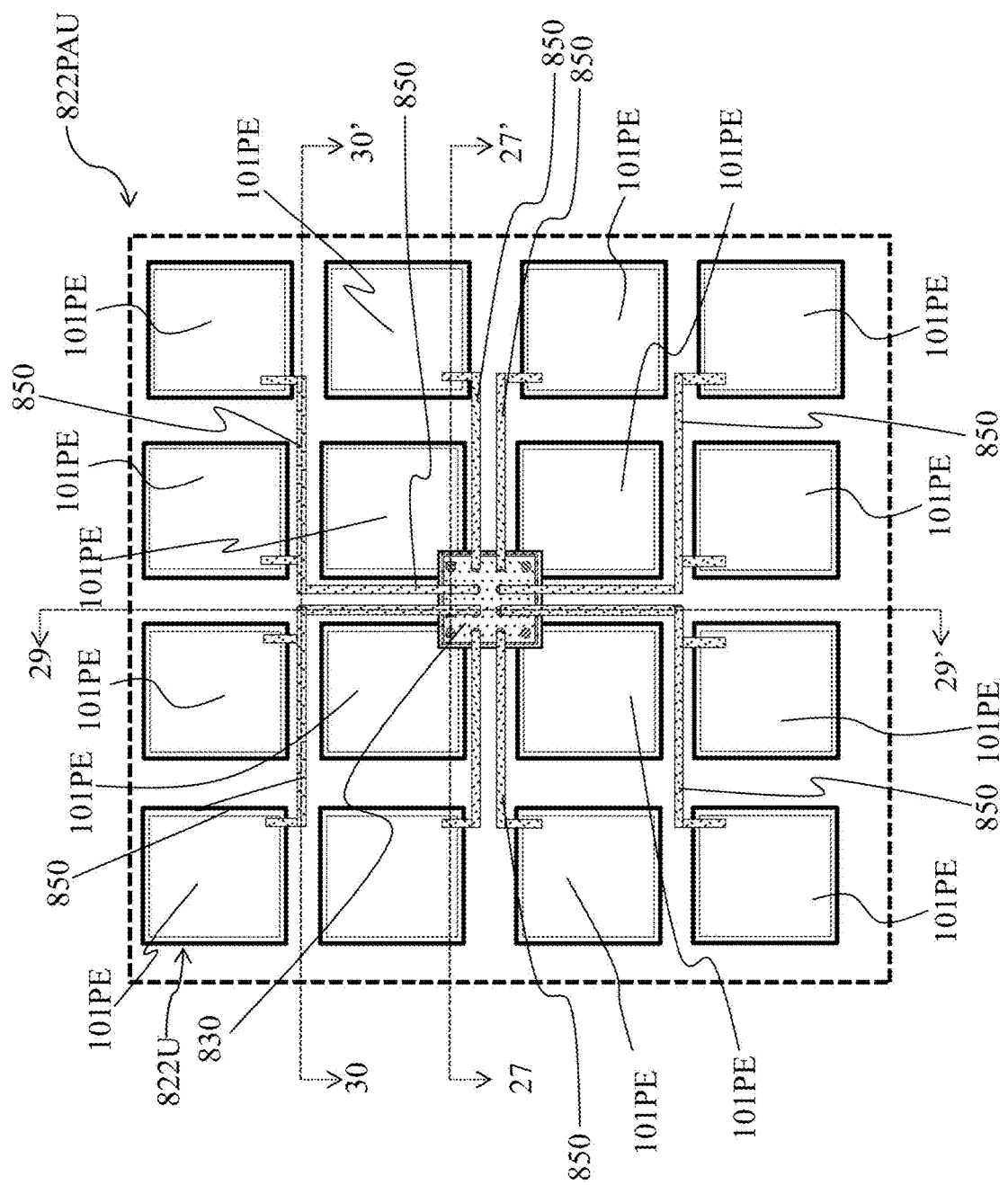
FIG. 25 shows a top view of a pixel array according to another embodiment of the present invention.
Figure 26:
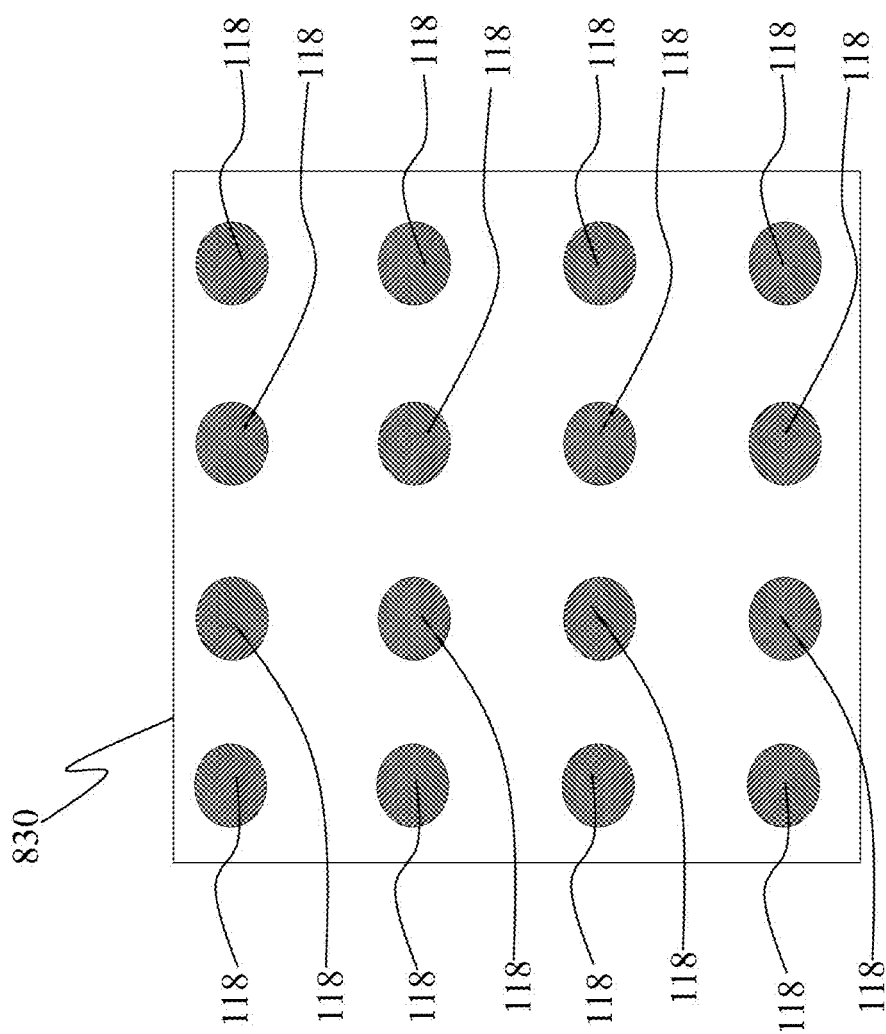
FIG. 26 is an enlarged diagram of a connecting module 830 of the pixel array in FIG. 25.
Figure 27:
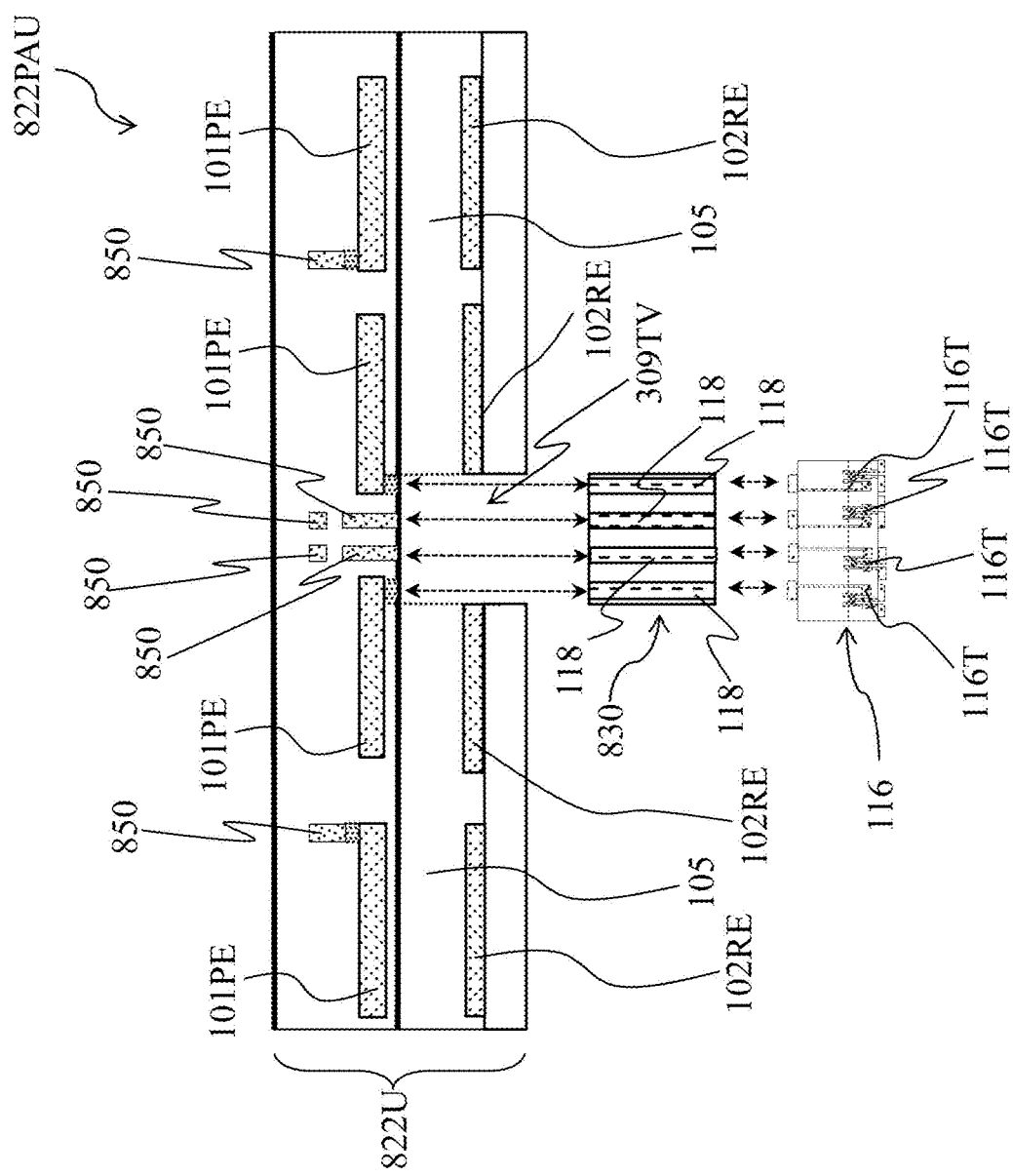
FIG. 27 is a cross-section view of the pixel array along the line 27-27' in FIG. 25.
Figure 28:
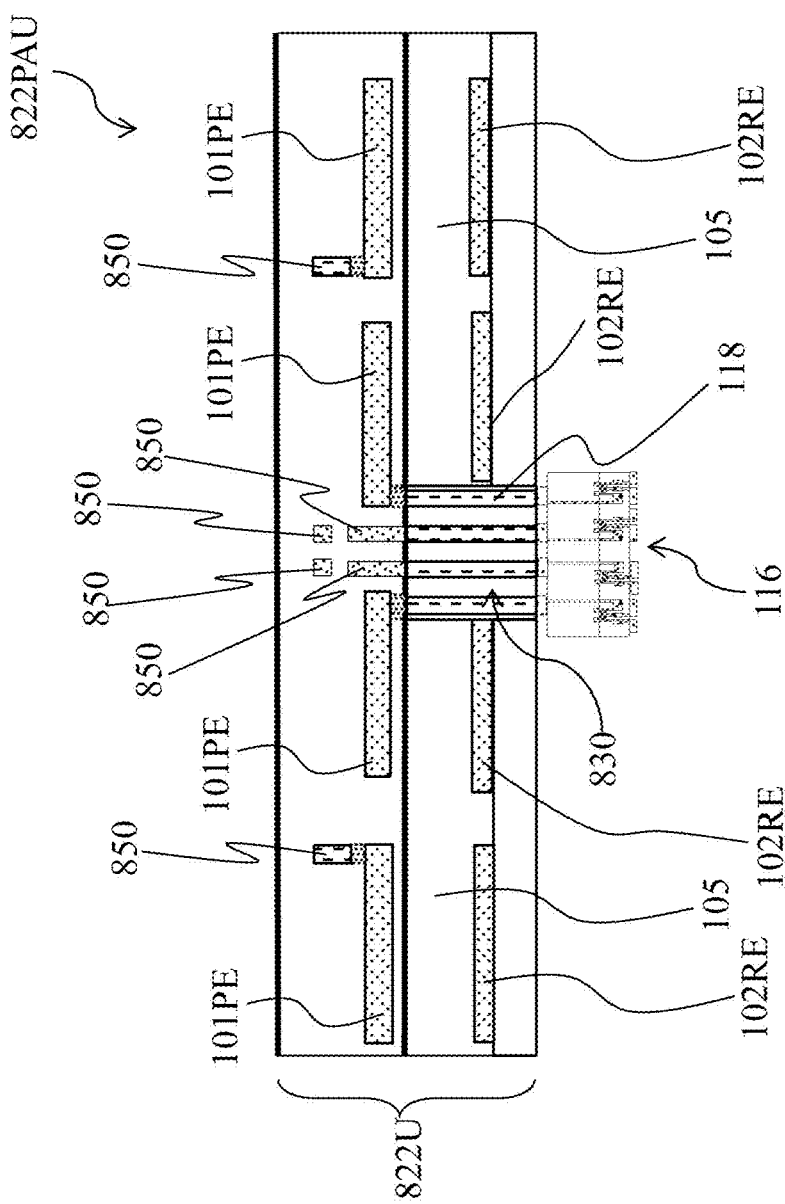
FIG. 28 is a schematic view showing the assembly of the pixel array.

Please refer to FIGS. 25 to 28. FIG. 25 shows a top view of a pixel array 822PAU according to another embodiment of the present invention. FIG. 26 is an enlarged diagram of a connecting module 830 of the pixel array 822PAU in FIG. 25. FIG. 27 is a cross-section view of the pixel array 822PAU along the line 27-27' in FIG. 25. FIG. 28 is a schematic view showing the assembly of the pixel array 822PAU. The pixel array 822PAU comprises a display medium module 822U, an active switching element 116, and a connecting module 830. The display medium module 822U comprises sixteen pairs of electrodes and a display medium 105. Each pair of electrodes comprises a first electrode 101PE and a second electrode 102RE. The display medium 105 is disposed between the first electrodes 101PE and the second electrodes 102RE of the display medium module 822U. The active switching element 116 is electrically connected to first electrodes 101PE for allowing the first electrodes 101PE and the second electrodes 102RE to change a state of the display medium 105. The connecting module 830 is an interposer integrated with the display medium module 822U and disposed in a perforation 309TV of the pixel array 822PAU. The connecting module 830 comprises sixteen conductors 118 for electrically connecting the active switching element 116 of the pixel array 822PAU to first electrodes 101PE of the display medium module 822U. The perforation 309TV may be formed in the pixel array 822PAU by using a laser beam, etching or punching the display medium module 822U.

Please refer to FIGS. 25 to 30. FIG. 29 is a cross-section view of the pixel array 822PAU along the line 29-29' in FIG. 25. FIG. 30 is a cross-section view of the pixel array 822PAU along the line 30-30' in FIG. 25. Some of the conductors 118 of the connecting module 830 are coupled to first electrodes 101PE of the display medium module 822U through a plurality of conductors 850, such that the transistor portions 116T of the active switching element 116 could charge the first electrodes 101PE through the conductors 118 and 850. The conductors 850 may be formed in one or more layers of the display medium module 822U as shown in FIGS. 29 and 30, such that the first electrodes 101PE could be charged and/or discharged individually by the active switching element 116.

Figure 31:
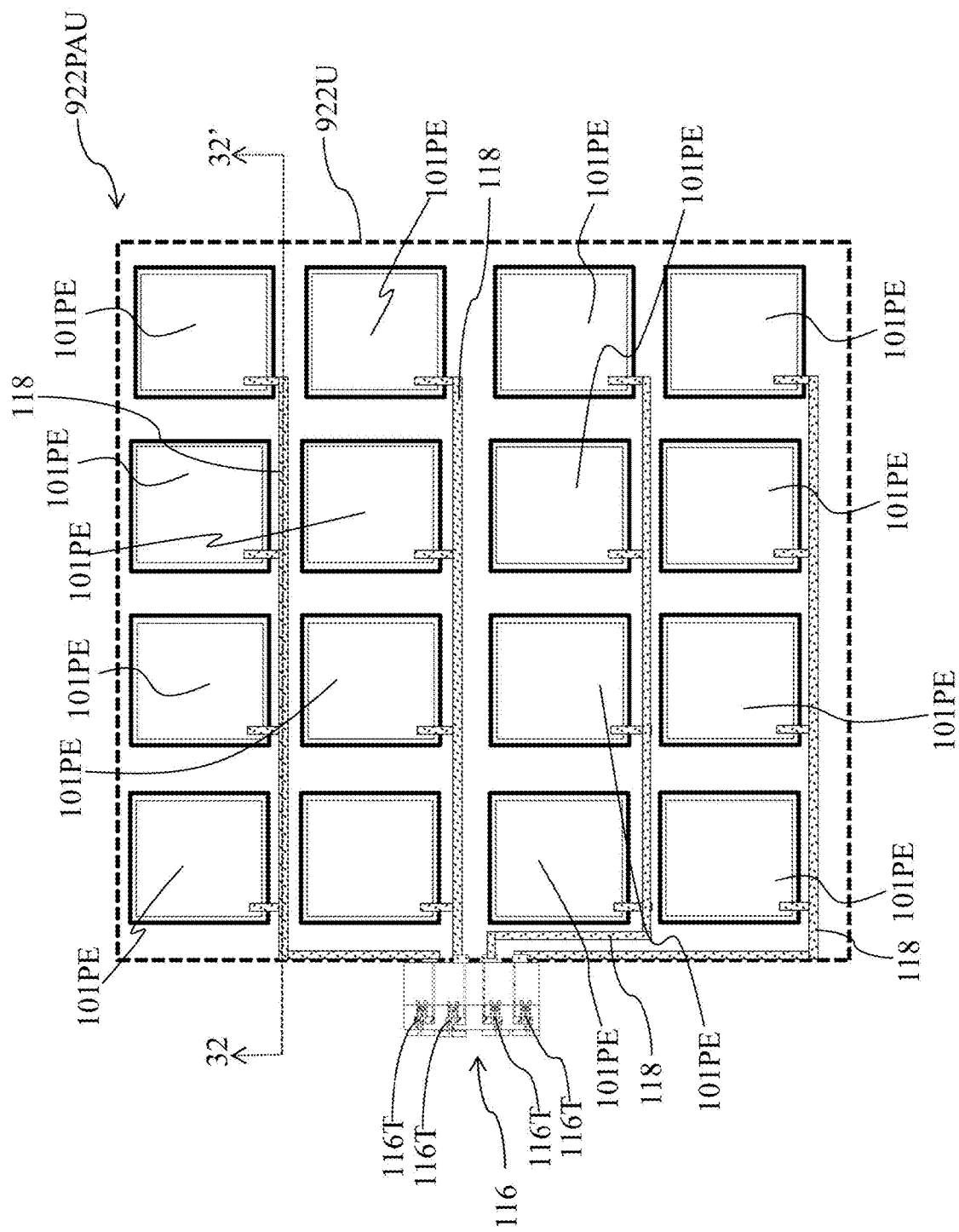
FIG. 31 shows a top view of a pixel array according to another embodiment of the present invention.
Figure 32:
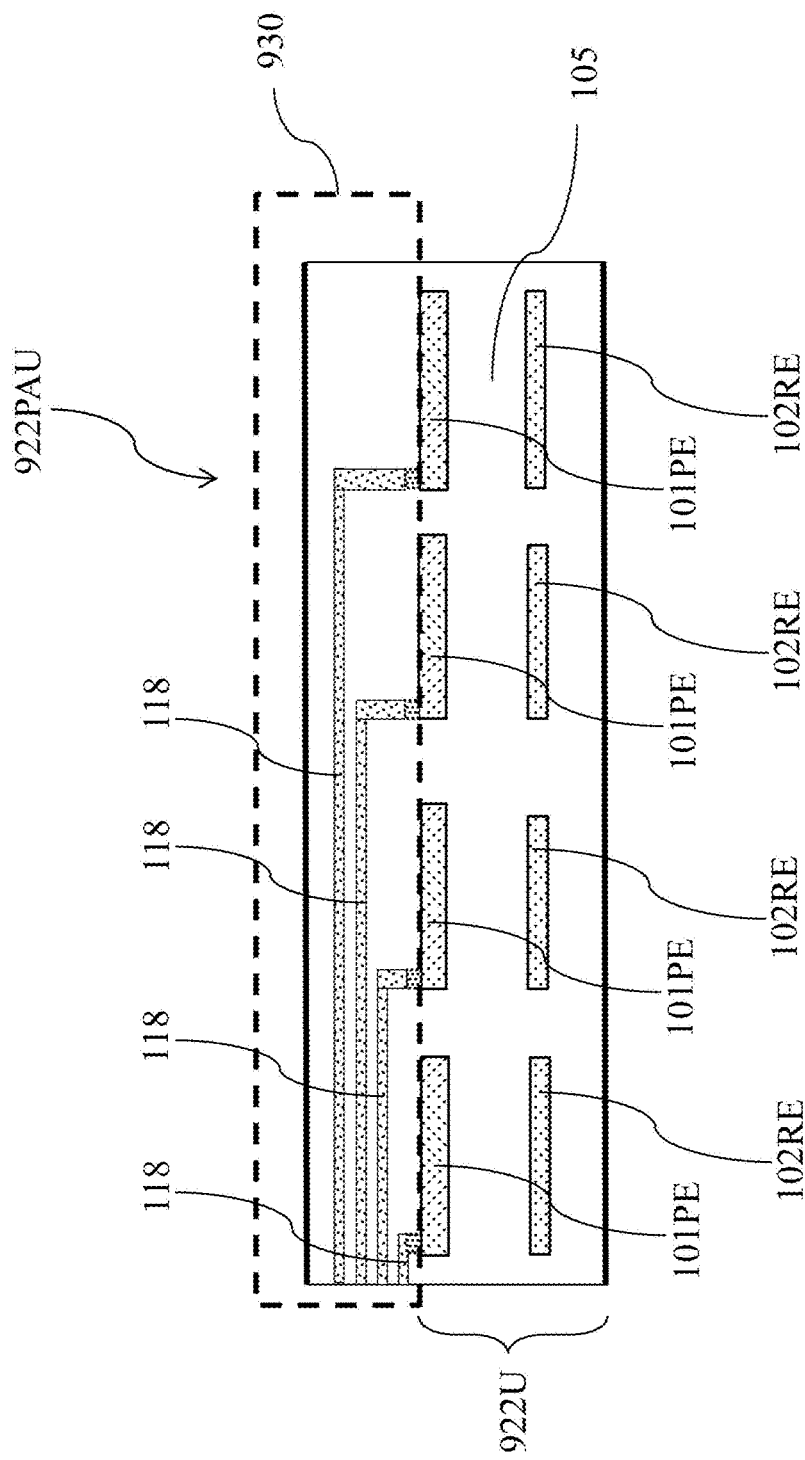
FIG. 32 is a cross-section view of the pixel array along the line 32-32' in FIG. 31.

Please refer to FIGS. 31 to 32. FIG. 31 shows a top view of a pixel array 922PAU according to another embodiment of the present invention. FIG. 32 is a cross-section view of the pixel array 922PAU along the line 32-32' in FIG. 31. The pixel array 922PAU comprises a display medium module 922U, an active switching element 116, and a connecting module 930 disposed on the display medium module 922U. The display medium module 922U comprises sixteen pairs of electrodes and a display medium 105. Each pair of electrodes comprises a first electrode 101PE and a second electrode 102RE. The display medium 105 is disposed between the first electrodes 101PE and the second electrodes 102RE of the display medium module 822U. The active switching element 116 is electrically connected to first electrodes 101PE for allowing the first electrodes 101PE and the second electrodes 102RE to change a state of the display medium 105. The connecting module 930 is integrated with the display medium module 922U and comprises a plurality of conductors 118 for electrically connecting the active switching element 116 of the pixel array 822PAU to first electrodes 101PE of the display medium module 822U. The conductors 118 may be formed in one or more layers of the display medium module 922U as shown in FIG. 32, such that the first electrodes 101PE could be charged and/or discharged individually by the active switching element 116.

The foregoing description illustrates the technical content of pixel unit, pixel array, multimedia device, and a manufacturing method thereof, and a display device according to various embodiments of the present invention. The foregoing description is illustrated of the present invention rather than limiting of the present invention. Any change easily made by those ordinarily skilled in the art of the present invention or any equivalent arrangement falls within the spirit and scope of the present invention, which is illustrated in the appended claims.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel array comprising:
a display medium module comprising at least two pairs of electrodes and a display medium, each pair of electrodes comprising a first electrode and a second electrode, and the display medium being disposed between first electrodes and second electrodes of the display medium module;
an active switching element electrically connected to the first electrodes for allowing the first electrodes and the second electrodes to change a state of the display medium; and
a connecting module, integrated with the display medium module and comprising a plurality of conductors for electrically connecting the active switching element of the pixel array to first electrodes of the display medium module; wherein the connecting module is a pitch connector, and a pitch between two conductors contacting with the active switching element is less than a pitch between two conductors contacting with two of the first electrodes.

2. The pixel array of claim 1, wherein the connecting module is an interposer disposed in a perforation of the display medium module and/or the pixel array.

3. The pixel array of claim 1, wherein the active switching element comprises an active switching element substrate portion and a transistor portion formed directly on the active switching element substrate portion.

4. The pixel array of claim 1, wherein the connecting module is disposed on the display medium module, the active switching element and/or the pixel array.

5. The pixel array of claim 1, wherein the connecting module comprises an electromagnetic interference (EMI) shield and/or an insulating material for electrically isolating the conductors from each other.

6. The pixel array of claim 1, wherein the display medium comprises at least one member selected from a group consisting of a self-luminous medium material, a non-self-luminous medium material, a light-filtering material, an electric conductive material, an insulating material, a light absorbing material, a light reflecting material, a photorefractive material, a light deflecting material and a light diffusing material.

7. The pixel array of claim 1, wherein the display medium module has a square shape, a rectangular shape, a fan shape, a triangular shape, a trapezoidal shape, a circular shape, a rhombus shape, a rectangle shape, a regular polygon shape, a polygon shape, or an irregular shape.

8. The pixel array of claim 1 further comprising a light source substrate, wherein the light source substrate and/or the connecting module comprises at least one member selected from a group consisting of a light polarization structure, a light refraction structure, a light reflection structure, a diffusion structure, a light guiding structure, and a brightening structure.

9. A display apparatus comprising:
a plurality of pixel arrays, each pixel array comprising:
a display medium module comprising at least two pairs of electrodes and a display medium, each pair of electrodes comprising a first electrode and a second electrode, and the display medium being disposed between first electrodes and second electrodes of the display medium module;
an active switching element electrically connected to the first electrodes for allowing the first electrodes and the second electrodes to change a state of the display medium; and
a connecting module, integrated with the display medium module and comprising a plurality of conductors for electrically connecting the active switching element to first electrodes of the display medium module, wherein the connecting module is a pitch connector, and a pitch between two conductors contacting with the active switching element is less than a pitch between two conductors contacting with two of the first electrodes.

10. The display apparatus of claim 9, wherein the connecting module is an interposer disposed in a perforation of the display medium module and/or the pixel array.

11. The display apparatus of claim 9, wherein the active switching element comprises an active switching element substrate portion and a transistor portion formed directly on the active switching element substrate portion.

12. The display apparatus of claim 9, wherein each connecting module is disposed on the display medium module, the active switching element and/or the pixel array.

13. The display apparatus of claim 9, wherein each connecting module comprises an electromagnetic interference (EMI) shield and/or an insulating material for electrically isolating the conductors from each other.

14. The display apparatus of claim 9 further comprising a light source substrate, wherein the light source substrate and/or the connecting module comprises at least one member selected from a group consisting of a light polarization structure, a light refraction structure, a light reflection structure, a diffusion structure, a light guiding structure, and a brightening structure.

15. A method for manufacturing a pixel array, comprising:
forming a display medium module of the pixel array, the display medium module comprising at least two pairs of electrodes and a display medium, each pair of electrodes comprising a first electrode and a second electrode, and a display medium being disposed between first electrodes and second electrodes of the display medium module;

forming an active switching element of the pixel array, the active switching element being electrically connected to the first electrodes for allowing the first electrodes and the second electrodes to change a state of the display medium; and embedding a connecting module with the display medium module to electrically connect the active switching element to the first electrodes via a plurality of conductors of the connecting module, wherein the connecting module is a pitch connector, and a pitch between two conductors contacting with the active switching element is less than a pitch between two conductors contacting with two of the first electrodes.

16. The method of claim 15, further comprising:

forming a perforation in the pixel array; and wherein the connecting module is an interposer disposed in the perforation.

17. The method of claim 16, wherein the perforation is formed in the pixel array by using a laser beam, etching or punching the display medium module.

18. The method of claim 15, wherein the connecting module is disposed on the display medium module and/or the display array.

19. The method of claim 15, wherein the active switching element comprises an active switching element substrate portion and a transistor portion formed directly on the active switching element substrate portion.

20. The method of claim 15, wherein the connecting module comprises an electromagnetic interference (EMI) shield.

21. The method of claim 15, wherein the connecting module comprises insulating material for electrically isolating the conductors from each other.

* * * * *